United States Patent
Kopec et al.

(10) Patent No.: US 12,076,863 B2
(45) Date of Patent: *Sep. 3, 2024

(54) AUTOTEACH SYSTEM

(71) Applicant: Applied Materials, Inc., Santa Clara, CA (US)

(72) Inventors: Nicholas Michael Kopec, Sunnyvale, CA (US); Lyle Kosinski, San Jose, CA (US); Matvey Farber, Redwood City, CA (US); Jeffrey Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/850,296

(22) Filed: Jun. 27, 2022

(65) Prior Publication Data

US 2022/0324100 A1     Oct. 13, 2022

Related U.S. Application Data

(63) Continuation of application No. 16/708,337, filed on Dec. 9, 2019, now Pat. No. 11,370,114.

(51) Int. Cl.
*H01L 21/67*        (2006.01)
*B25J 9/16*         (2006.01)
(Continued)

(52) U.S. Cl.
CPC ............ *B25J 9/163* (2013.01); *B25J 9/1653* (2013.01); *B25J 21/005* (2013.01); *H01L 21/00* (2013.01);
(Continued)

(58) Field of Classification Search
CPC ........ B25J 9/163; B25J 9/1653; B25J 21/005; B25J 9/1674; B25J 9/1692; B25J 9/1656;
(Continued)

(56) References Cited

U.S. PATENT DOCUMENTS

| 4,763,276 A | 8/1988 | Perreirra et al. |
| 5,297,238 A | 3/1994 | Wang et al. |

(Continued)

FOREIGN PATENT DOCUMENTS

| CN | 1934695 A | 3/2007 |
| CN | 101223010 A | 7/2008 |

(Continued)

OTHER PUBLICATIONS

International Search Report and Written Opinion for International Application No. PCT/US2020/027768, mailed Jul. 22, 2020, 7 Pages.

(Continued)

*Primary Examiner* — Mohammed Shamsuzzaman
(74) *Attorney, Agent, or Firm* — Lowenstein Sandler LLP

(57) ABSTRACT

An autoteach system includes an autoteach pin that is a scannable feature having a fixed position within the autoteach system. The autoteach pin enables an autoteach operation of a robot arm of the wafer processing system. The autoteach operation is an operation to automatically teach the fixed position within the autoteach system to the robot arm of the wafer processing system. The autoteach pin includes a first portion including a cylindrical sidewall. The robot arm is to use the first portion to locate the fixed position within the autoteach system. The autoteach portion further includes a second portion including planar sidewalls that are configured to enable calibration of robot arm error.

18 Claims, 9 Drawing Sheets

(51) Int. Cl.
  *B25J 21/00* (2006.01)
  *H01L 21/00* (2006.01)
  *H01L 21/673* (2006.01)
(52) U.S. Cl.
  CPC .......... *H01L 21/67* (2013.01); *H01L 21/6735* (2013.01); *G05B 2219/45031* (2013.01)
(58) Field of Classification Search
  CPC ..... H01L 21/00; H01L 21/67; H01L 21/6735; H01L 21/68; H01L 21/687; G05B 2219/45031; G05B 2219/45063
  See application file for complete search history.

(56) References Cited

U.S. PATENT DOCUMENTS

| | | | |
|---|---|---|---|
| 6,323,616 B1 | 11/2001 | Sagues et al. | |
| 6,489,741 B1 | 12/2002 | Genov et al. | |
| 6,643,563 B2 | 11/2003 | Hosek et al. | |
| 6,934,606 B1 * | 8/2005 | Genetti | H01L 21/681 118/712 |
| 7,039,498 B2 | 5/2006 | Bacchi et al. | |
| 7,572,092 B2 | 8/2009 | Hofmeister et al. | |
| 7,792,350 B2 | 9/2010 | Kiley et al. | |
| 7,874,782 B2 | 1/2011 | Hashimoto | |
| 7,904,202 B2 * | 3/2011 | Hoppe | B25J 9/1692 700/250 |
| 8,397,739 B2 | 3/2013 | Gregor et al. | |
| 8,784,033 B2 | 7/2014 | Kremerman et al. | |
| 9,252,035 B2 | 2/2016 | Furuichi et al. | |
| 9,457,464 B2 | 10/2016 | Kremerman et al. | |
| 9,579,788 B2 | 2/2017 | Rosenberg et al. | |
| 9,881,820 B2 | 1/2018 | Wong et al. | |
| 9,908,236 B2 | 3/2018 | Minami et al. | |
| 9,947,517 B1 | 4/2018 | Luere et al. | |
| 10,014,198 B2 | 7/2018 | Richardson | |
| 10,041,868 B2 | 8/2018 | Gottscho | |
| 10,062,589 B2 | 8/2018 | Wong et al. | |
| 10,062,590 B2 | 8/2018 | Wong et al. | |
| 10,062,599 B2 | 8/2018 | Genetti et al. | |
| 10,103,010 B2 | 10/2018 | Luere et al. | |
| 10,124,492 B2 | 11/2018 | Genetti et al. | |
| 11,370,114 B2 * | 6/2022 | Kopec | B25J 9/1653 |
| 2005/0021177 A1 | 1/2005 | Bacchi et al. | |
| 2005/0228542 A1 | 10/2005 | Stone et al. | |
| 2008/0179287 A1 | 7/2008 | Collins et al. | |
| 2010/0174398 A1 | 7/2010 | Kobayashi et al. | |
| 2013/0068656 A1 | 3/2013 | Sheng et al. | |
| 2013/0275057 A1 | 10/2013 | Perlin et al. | |
| 2013/0319137 A1 | 12/2013 | Grau et al. | |
| 2014/0350713 A1 | 11/2014 | Kimura | |
| 2016/0211165 A1 | 7/2016 | McChesney et al. | |
| 2016/0211166 A1 | 7/2016 | Yan et al. | |
| 2016/0216185 A1 | 7/2016 | Gottscho | |
| 2017/0053819 A1 | 2/2017 | Richardson | |
| 2017/0106533 A1 | 4/2017 | Minami et al. | |
| 2017/0113355 A1 | 4/2017 | Genetti et al. | |
| 2017/0115657 A1 | 4/2017 | Trussell et al. | |
| 2017/0117172 A1 | 4/2017 | Genetti et al. | |
| 2017/0119339 A1 | 5/2017 | Johnson et al. | |
| 2017/0133283 A1 | 5/2017 | Kenworthy | |
| 2017/0170044 A1 | 6/2017 | Okabe et al. | |
| 2017/0213758 A1 | 7/2017 | Rice et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0263478 A1 | 9/2017 | McChesney et al. | |
| 2017/0287682 A1 | 10/2017 | Musselman et al. | |
| 2017/0287753 A1 | 10/2017 | Musselman et al. | |
| 2017/0330786 A1 | 11/2017 | Genetti et al. | |
| 2017/0334074 A1 | 11/2017 | Genetti et al. | |
| 2018/0001478 A1 | 1/2018 | Freeman et al. | |
| 2018/0019107 A1 | 1/2018 | Ishizawa | |
| 2018/0019142 A1 | 1/2018 | Wong et al. | |
| 2018/0032062 A1 | 2/2018 | Trussell et al. | |
| 2018/0033666 A1 | 2/2018 | Watanabe et al. | |
| 2018/0040492 A1 | 2/2018 | Wong et al. | |
| 2018/0068879 A1 | 3/2018 | Wong et al. | |
| 2018/0090354 A1 | 3/2018 | Sugita et al. | |
| 2018/0166259 A1 | 6/2018 | Ueda | |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0315583 A1 | 11/2018 | Luere et al. | |
| 2018/0315640 A1 | 11/2018 | Ueda et al. | |
| 2018/0361579 A1 | 12/2018 | Kelly | |
| 2020/0254625 A1 * | 8/2020 | Rogers | G05B 19/18 |
| 2020/0324410 A1 * | 10/2020 | Bergantz | B25J 9/163 |
| 2021/0257233 A1 * | 8/2021 | Narasimhan | H01L 21/67201 |

FOREIGN PATENT DOCUMENTS

| | | | | |
|---|---|---|---|---|
| CN | 103021913 A | | 4/2013 | |
| CN | 107039308 A | | 8/2017 | |
| CN | 109979305 A | * | 7/2019 | ....... G05B 19/41875 |
| JP | 2005277175 A | | 10/2005 | |
| JP | 2005310858 A | | 11/2005 | |
| JP | 2012231041 A | | 11/2012 | |
| JP | 2014192230 A | | 10/2014 | |
| JP | 2016043424 A | | 4/2016 | |
| JP | 2019176029 A | | 10/2019 | |
| KR | 20010006828 A | | 1/2001 | |
| KR | 20040044860 A | | 5/2004 | |
| KR | 20080009745 A | | 1/2008 | |
| KR | 101957096 B1 | | 3/2019 | |
| TW | 200846667 A | | 12/2008 | |
| WO | 03022534 A1 | | 3/2003 | |
| WO | WO-2021021501 A1 | * | 2/2021 | ....... G05B 19/41875 |
| WO | WO-2021022291 A1 | * | 2/2021 | ........... B25J 9/1692 |
| WO | 2021119180 A1 | | 6/2021 | |

OTHER PUBLICATIONS

International Search Report and Written Opinion of the International Searching Authority for PCT Application No. PCT/US2020/064090, mailed May 6, 2021.

* cited by examiner

AUTOTEACH SYSTEM

RELATED APPLICATION

This application is a continuation of U.S. patent application Ser. No. 16/708,337, filed Dec. 9, 2019, the entire contents of which are incorporated by reference herein.

TECHNICAL FIELD

Embodiments of the present disclosure relate to enclosure systems, such as those used in wafer processing systems, and in particular to enclosure systems configured to enable an autoteach operation.

BACKGROUND

In semiconductor processing and other electronics processing, platforms are often used that use robotic arms to transport objects, such as wafers, between processing chambers, from storage areas (e.g., front opening unified pods (FOUPs)) to processing chambers, from processing chambers to storage areas, and so on. A processing system, such as a wafer processing system, has one or more processing chambers for processing of wafers. A gas may be used to etch a wafer in a processing chamber (e.g., a wafer may be etched while electrostatically clamped in position in an etch chamber). The robotic arms are to pick up objects from specific locations and transport the objects to specific locations.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, an autoteach enclosure system includes a plurality of surfaces that at least partially enclose an interior volume of the autoteach enclosure system. The autoteach enclosure system further includes an autoteach pin at least partially disposed within the interior volume. The autoteach pin is a scannable feature having a fixed position within the autoteach enclosure system. The autoteach enclosure system further includes a front interface coupled to one or more of the plurality of surfaces to interface the autoteach enclosure system with a substantially vertical portion of a load port of a wafer processing system. The autoteach pin enables an autoteach operation of a robot arm of the wafer processing system. The autoteach operation is an operation to automatically teach the fixed position within the autoteach enclosure system to the robot arm of the wafer processing system.

In another aspect of the disclosure, a method includes interfacing a front interface of an autoteach enclosure system with a substantially vertical portion of a load port of a factory interface of a wafer processing system to establish a sealed environment including an interior volume of the autoteach enclosure system and an interior of the factory interface. The method further includes scanning, by a robot arm of the factory interface, an autoteach pin disposed within the interior volume of the autoteach enclosure system while maintaining the sealed environment. The method further includes determining, based on a result of the scanning, a fixed location associated with the autoteach enclosure system. Content is to be transferred by the robot arm based on the fixed location.

In another aspect of the disclosure, an enclosure system includes a plurality of surfaces that at least partially enclose an interior volume of the enclosure system. The enclosure system further includes a plurality of support structures disposed in the interior volume. The enclosure system further includes a calibration substrate disposed on the plurality of support structures in the interior volume. The calibration substrate includes a calibration pin. The enclosure system further includes a front interface coupled to one or more of the plurality of surfaces. The front interface is configured to interface the enclosure system with a substantially vertical portion of a load port of a wafer processing system. The calibration substrate enables a calibration operation of a robot arm of the wafer processing system to automatically determine robot arm error of the robot arm.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
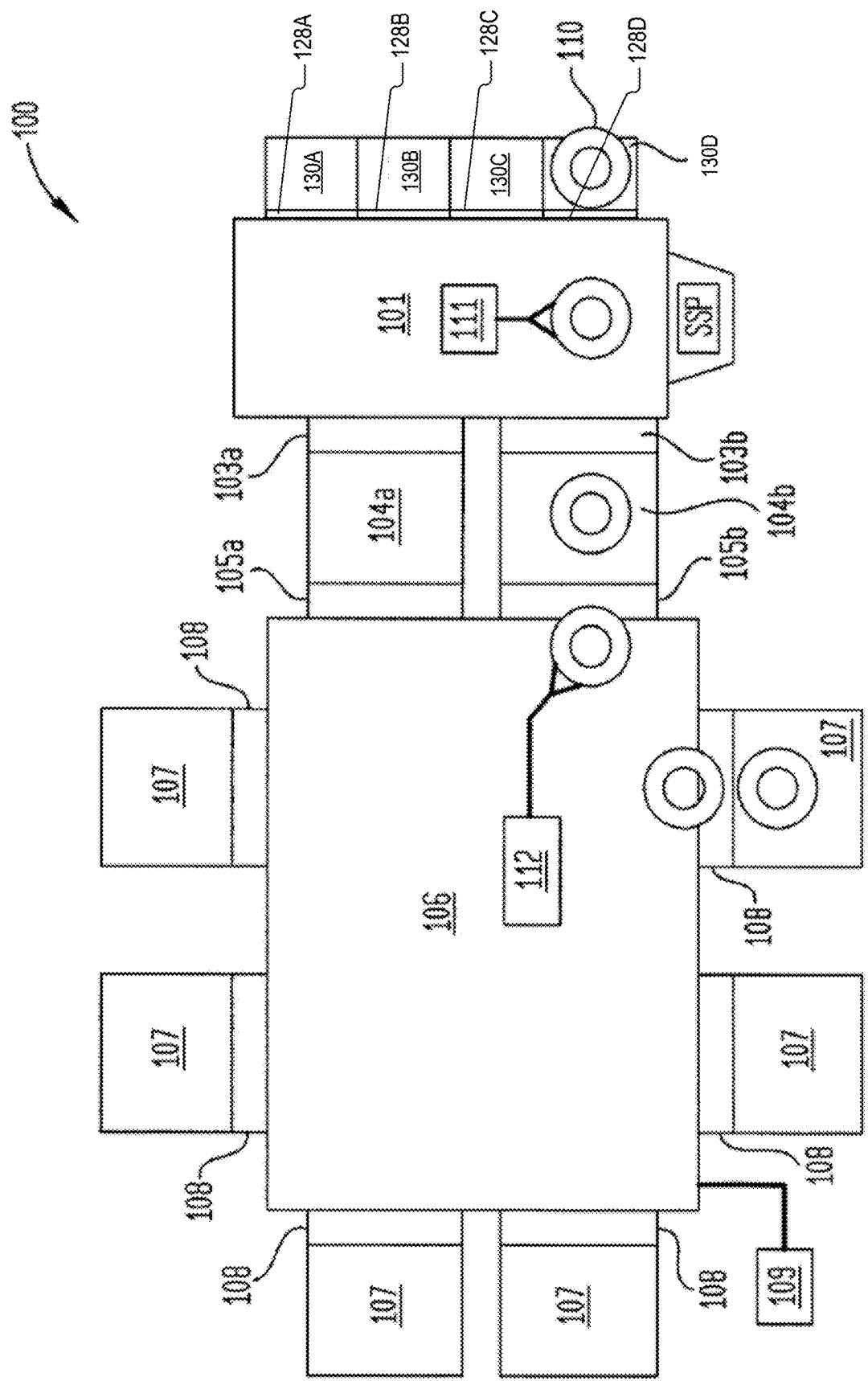
FIG. 1 illustrates a processing system, according to certain embodiments.

Embodiments described herein are related to an autoteach enclosure system. A robot arm (e.g., of an atmospheric robot, factory interface robot, etc.) is disposed inside a factory interface of a wafer processing system and moves wafers within the wafer processing system. An enclosure system (e.g., FOUP or other substrate enclosure system) is used to transport objects, such as wafers. The enclosure system provides a sealed environment during transport. The enclosure system interfaces with (e.g., docks to, seals to, etc.) a wafer processing system, resulting in a sealed environment that includes an interior volume of the enclosure system and an interior volume of the factory interface. The robot arm removes objects from and/or inserts objects into the enclosure system during operation, and the enclosure system is closed and removed (e.g., sealed with a door and undocked) from the wafer processing system once the wafers of the enclosure system have completed processing. The robot arm is to pick up wafers from specific locations from the enclosure system and place wafers at specific locations in the enclosure system.

Robot arms with errors cause damage to wafers, the enclosure system, and/or the robotic arm. Robot arm errors are related to teaching, calibration, and/or component diagnosis. Teaching refers to teaching the robot arm the location (e.g., a reference point) of the enclosure system. For example, the reference point may be a center of the enclosure system. Calibration refers to determining errors in the movement of the robot arm (e.g., joint kinematic errors, joint hysteresis, and joint backlash), and to adjusting settings of the robot arm to compensate for the determined errors. Diagnosis refers to determining whether a component of the robot arm is malfunctioning. For example, an end effector of a robot arm has a planar upper surface, protrusions (e.g., fangs) that extend upward from the planar upper surface, and a plunger disposed above the planar upper surface. The end effector is configured to grip a substrate disposed on the planar upper surface by actuating the plunger to secure the substrate between the actuated plunger and the protrusions on the distal ends. The diagnosis may be performed to determine that the plunger of the robot arm is malfunctioning (e.g. the plunger does not extend far enough to secure the substrate, the plunger does not actuate fast enough, etc.).

If the robot arm has not been taught the location of an enclosure system (e.g., the center location of the enclosure system), the robot arm will attempt to pick up wafers from erroneous locations and/or place wafers onto erroneous locations. Picking up wafers from erroneous locations and/or placing wafers at erroneous locations causes damage to the wafers, the enclosure system, and/or the robotic arm. Additionally, even if the robot arm is directed to pick and place wafers at correct locations, if the robot arm is not calibrated then it will often not actually achieve picking and placing at those correct locations. If the robot arm has not been calibrated, an error in the movement of the robot arm, resulting from not being calibrated, causes the robot arm to pick up wafers from erroneous locations and/or place wafers onto erroneous locations, which causes damage to the wafers, the enclosure system, and/or the robotic arm. Additionally, even if the robot arm is taught the center or zero location of the enclosure system and has been calibrated, it may malfunction, also resulting in damage to the wafers, the enclosure system, and/or the robotic arm. Accordingly, in some embodiments diagnostics are performed to determine whether a robot arm is malfunctioning and/or to determine how the robot arm is malfunctioning. Errors resulting from the robot arm not being taught the correct location of an enclosure system, movement of the robot arm not being calibrated, and/or malfunctioning components of the robot arm not being correctly diagnosed can further cause result in wafers being improperly processed.

Conventionally, teaching the robot arm a location, calibrating movement of the robot arm, and diagnosing malfunctioning components of the robot arm (e.g., determining errors of the robot arm, speed of the robot arm dropping below a threshold speed, etc.) are manual processes. For the manual process, a technician opens the wafer processing system (resulting in exposing a sealed environment within a factory interface of the wafer processing system to atmosphere), manually handles the robot arm (potentially introducing contaminants to the robot arm), and manually performs teaching, calibration, and diagnosis. After being opened, the wafer processing system goes through a long requalification process, during which the wafer processing system is not used to process wafers. The requalification process impacts line yield, scheduling, quality, user time, energy used, and so forth.

The devices, systems, and methods disclosed herein provide an autoteach enclosure system (e.g., FOUP) to enable one or more of an autoteach operation, a calibration operation, or a diagnostic operation. In one embodiment, an autoteach enclosure system includes surfaces (e.g., top surface, side surfaces, bottom surface, rear surface, etc.) that at least partially enclose an interior volume of the autoteach enclosure system. An autoteach pin is at least partially disposed within the interior volume. The autoteach pin is a scannable feature (e.g., a cylindrical feature that can be scanned by a robot arm) having a fixed position within the autoteach enclosure system. A front interface (e.g., door frame) coupled to one or more of the surfaces (e.g., side surfaces, top surface, bottom surface, etc.) interfaces (e.g., seals) the autoteach enclosure system with a substantially vertical portion of a load port of a wafer processing system. The autoteach enclosure system includes a baseplate secured to the bottom surface (e.g., bottom wall) of the surfaces (e.g., walls) of the autoteach enclosure system. The autoteach pin is secured to the baseplate and extends through the bottom surface into the interior volume. The baseplate interfaces the autoteach enclosure system with a substantially horizontal portion of the load port. The substantially horizontal portion includes kinematic devices (e.g., kinematic pins, kinematic flange, etc.) to position the autoteach enclosure system in an exact position (e.g., in the same position each time the autoteach enclosure system interfaces with the load port). A robot arm scans the autoteach pin to perform an autoteach operation. The autoteach operation is an operation to automatically determine a fixed location (e.g., center) of one or more of the autoteach enclosure system, the substantially horizontal portion of the load port, the kinematic devices, or the like (e.g., based on the location of the autoteach pin). The robot arm uses the determined fixed location to remove objects from and/or insert objects into other enclosure systems that interface with the load port.

In some embodiments, a calibration substrate is disposed on support structures in the interior volume of the autoteach enclosure system. The calibration substrate is substantially horizontal and includes a calibration pin that is secured to an upper surface of the calibration substrate. The robot arm uses the calibration substrate to perform a calibration operation. The robot arm scans the calibration pin to determine a first location of the calibration substrate (e.g., of the calibration pin), removes the calibration substrate from the support structures (e.g., remove the calibration substrate from the autoteach enclosure system), is directed to place the calibration substrate at the first location on the support structures, scans the calibration pin to determine a second location of the calibration substrate, and determines robot arm error based on a difference between the first location and the second location.

In one embodiment, the robot arm is used by the calibration substrate to perform a diagnostic operation. The calibration substrate has a first width in a first orientation and a second width in a second orientation. In some examples, the perimeter of the calibration substrate includes a notch. The robot arm is moved to be disposed under the calibration substrate in the first orientation, a plunger of the robot arm is actuated to secure the calibration substrate in the first orientation, and it is determined whether a first error occurs in securing the calibration substrate in the first orientation. The same process is repeated in the second orientation to determine if a second error occurs in securing the calibration substrate in the second orientation. In some embodiments, the first or second error include one or more of the plunger taking more than a threshold amount of time to secure against the calibration substrate, the distance that the plunger extended not equaling the distance between the robot arm and the calibration substrate, or the like.

The devices, systems, and methods disclosed herein have advantages over conventional solutions. The autoteach enclosure system interfaces with a load port of the wafer processing system and enables one or more of an automatic autoteach operation, an automatic calibration operation, and/or an automatic component diagnostic operation without opening of the wafer processing system (e.g., without opening a factory interface of the wafer processing system) and without a subsequent requalification process of the wafer processing system (e.g., enable performance of the operations while maintaining a sealed environment). The load port is configured to accept different types of enclosure systems, such as a front opening unified pod (FOUP). The load port seals to the front interface of the autoteach enclosure system to prevent contamination in the wafer processing system (factory interface), to prevent harmful gases from exiting the wafer processing system (factory interface), and/or to maintain an inert environment within the factory interface. The autoteach enclosure system includes an autoteach pin to enable the autoteach operation. In some embodiments, the autoteach enclosure system includes a calibration substrate to enable one or more of the calibration operation or the diagnostic operation. The autoteach enclosure system is used to learn a fixed location relative to the load port, robot arm error, and/or problems of the robot arm to enable the robot arm to be controlled to remove wafers from and place wafers on exact locations. In doing so, the autoteach enclosure system reduces errors in wafers and reduces damage to robot arms, enclosure systems, and/or wafer processing systems. Use of the autoteach enclosure system has less impact on line yield, scheduling, quality, user time, energy used, and so forth than conventional solutions.

An autoteach enclosure system being used for an autoteach operation is for purposes of illustration, rather than limitation. In some embodiments, the autoteach enclosure system is used for one or more of a calibration operation, a diagnostic operation, or an autoteach operation. In some embodiments, the autoteach enclosure system is not used for an autoteach operation (e.g., is used for calibration and/or diagnostic operation without an autoteach operation).

FIG. 1 illustrates a processing system 100 (e.g., a wafer processing system), according to certain embodiments. The processing system 100 includes a factory interface 101 and load ports 128 (e.g., load ports 128A-D). In some embodiments, the load ports 128A-D are directly mounted to (e.g., seal against) the factory interface 101. Enclosure systems 130 (e.g., cassette, FOUP, process kit enclosure system, autoteach enclosure system, or the like) are configured to removably couple (e.g., dock) to the load ports 128A-D.

Referring to FIG. 1, enclosure system 130A is coupled to load port 128A, enclosure system 130B is coupled to load port 128B, enclosure system 130C is coupled to load port 128C, and enclosure system 130D is coupled to load port 128D. In some embodiments, one or more enclosure systems 130 are coupled to the load ports 128 for transferring wafers and/or other substrates into and out of the processing system 100. Each of the enclosure systems 130 may seal against a respective load port 128. In some embodiments, a first enclosure system 130A is docked to a load port 128A (e.g., for teaching, calibrating and/or diagnosing a robot arm of the factory interface 101). Once such operation or operations are performed, the first enclosure system 130A is then undocked from the load port 128A, and then a second enclosure system 130 (e.g., a FOUP containing wafers) is docked to the same load port 128A. In some embodiments, an enclosure system 130 (e.g., enclosure system 130A) is an autoteach enclosure system for performing one or more of an autoteach operation, a calibration operation, or a diagnostic operation. In some embodiments, an enclosure system 130 (e.g., enclosure system 130B) is a process kit enclosure system for transferring content 110 such as process kit rings into and out of the processing system 100.

In some embodiments, a load port 128 includes a front interface that forms a vertical opening (or a substantially vertical opening). The load port 128 additionally includes a horizontal surface for supporting an enclosure system 130 (e.g., cassette, autoteach enclosure system). Each enclosure system 130 (e.g., FOUP of wafers, autoteach enclosure system, process kit enclosure system) has a front interface that forms a vertical opening. The front interface of the enclosure system 130 is sized to interface with (e.g., seal to) the front interface of the load port 128 (e.g., the vertical opening of the enclosure system 130 is approximately the same size as the vertical opening of the load port 128). The enclosure system 130 is placed on the horizontal surface of the load port 128 and the vertical opening of the enclosure system 130 aligns with the vertical opening of the load port 128. The front interface of the enclosure system 130 interconnects with (e.g., clamp to, be secured to, be sealed to) the front interface of the load port 128. A bottom plate (e.g., base plate) of the enclosure system 130 has features (e.g., load features, such as recesses or receptacles, that engage with load port kinematic pin features, a load port feature for pin clearance, and/or an enclosure system docking tray latch clamping feature) that engage with the horizontal surface of the load port 128. The same load ports 128 that are used for different types of enclosure systems 130 (e.g., autoteach enclosure system, process kit enclosure system, cassettes that contain wafers, etc.).

In some embodiments, enclosure system 130 (e.g., autoteach enclosure system) includes an autoteach pin for performing an autoteach operation. In some embodiments, the enclosure system 130 includes a calibration substrate (e.g., including a calibration pin) for performing one or more of a calibration operation or a diagnostic operation. Accordingly, the enclosure system 130 may include both an autoteach pin and a calibration substrate.

In some embodiments, the enclosure system 130B (e.g., process kit enclosure system) includes one or more items of content 110 (e.g., one or more of a process kit ring, an empty process kit ring carrier, a process kit ring disposed on a process kit ring carrier, a placement validation wafer, etc.). In some examples, the enclosure system 130B is coupled to the factory interface 101 (e.g., via load port 128) to enable automated transfer of a process kit ring on a process kit ring carrier into the processing system 100 for replacement of a used process kit ring.

In some embodiments, the processing system 100 also includes first vacuum ports 103a, 103b coupling the factory interface 101 to respective degassing chambers 104a, 104b. Second vacuum ports 105a, 105b are coupled to respective degassing chambers 104a, 104b and disposed between the degassing chambers 104a, 104b and a transfer chamber 106 to facilitate transfer of wafers and content 110 (e.g., process kit rings) into the transfer chamber 106. In some embodiments, a processing system 100 includes and/or uses one or more degassing chambers 104 and a corresponding number of vacuum ports 103, 105 (e.g., a processing system 100 includes a single degassing chamber 104, a single first vacuum port 103, and a single second vacuum port 105). The transfer chamber 106 includes a plurality of processing chambers 107 (e.g., four processing chambers 107, six processing chambers 107, etc.) disposed therearound and coupled thereto. The processing chambers 107 are coupled to the transfer chamber 106 through respective ports 108, such as slit valves or the like. In some embodiments, the factory interface 101 is at a higher pressure (e.g., atmospheric pressure) and the transfer chamber 106 is at a lower pressure (e.g., vacuum). Each degassing chamber 104 (e.g., load lock, pressure chamber) has a first door (e.g., first vacuum port 103) to seal the degassing chamber 104 from the factory interface 101 and a second door (e.g., second vacuum port 105) to seal the degassing chamber 104 from the transfer chamber 106. Content is to be transferred from the factory interface 101 into a degassing chamber 104 while the first door is open and the second door is closed, the first door is to close, the pressure in the degassing chamber 104 is to be reduced to match the transfer chamber 106, the second door is to open, and the content is to be transferred out of the degassing chamber 104. A local center finding (LCF) device is to be used to align the content in the transfer chamber 106 (e.g., before entering a processing chamber 107, after leaving the processing chamber 107).

In some embodiments, the processing chambers 107 includes one or more of etch chambers, deposition chambers (including atomic layer deposition, chemical vapor deposition, physical vapor deposition, or plasma enhanced versions thereof), anneal chambers, or the like.

Factory interface 101 includes a factory interface robot 111. Factory interface robot 111 includes a robot arm, such as a selective compliance assembly robot arm (SCARA) robot. Examples of a SCARA robot include a 2 link SCARA robot, a 3 link SCARA robot, a 4 link SCARA robot, and so on. The factory interface robot 111 includes an end effector on an end of the robot arm. The end effector is configured to pick up and handle specific objects, such as wafers. Alternatively, or additionally, the end effector is configured to handle objects such as a calibration substrate and process kit rings (edge rings). The end effector is also configured to scan objects (e.g., autoteach pin, calibration pin, etc.), which is described in greater detail below (e.g., FIGS. 4A-C). The robot arm has one or more links or members (e.g., wrist member, upper arm member, forearm member, etc.) that are configured to be moved to move the end effector in different orientations and to different locations.

The factory interface robot 111 is configured to transfer objects between enclosure systems 130 (e.g., cassettes, FOUPs) and degassing chambers 104a, 104b (or load ports). While conventional systems are associated with opening of (e.g., disassembly of, breaking the seal of, contaminating) a processing system 100 (e.g., factory interface 101) by an operator to teach, calibrate, and/or diagnose malfunctioning of a robot arm (e.g., of factory interface robot), the processing system 100 is configured to facilitate automatic teaching, calibrating, and/or diagnosis without opening of (e.g., disassembly of, breaking the seal of, contaminating) the processing system 100 by an operator. Accordingly, in embodiments a sealed environment including an interior volume of an enclosure system 130 and an internal volume of the factory interface 101 may be maintained during automatic teaching, calibrating and/or diagnostics operations.

The factory interface robot 111 is taught a fixed location relative to a load port 128 using the enclosure system 130 (e.g., autoteach pin of the autoteach enclosure system) in embodiments. The fixed location in one embodiment corresponds to a center location of an enclosure system 130A (e.g., autoteach enclosure system) placed at a particular load port 128, which in embodiments also corresponds to a center location of an enclosure system 130B (e.g., cassette of substrates) placed at the particular load port 128. Alternatively, the fixed location may correspond to other fixed locations within the enclosure system 130, such as a front or back of the enclosure system 130. The factory interface robot 111 is calibrated using the enclosure system 130 (e.g., autoteach pin and/or calibration substrate of the autoteach enclosure system) in some embodiments. The factory interface robot 111 is diagnosed using the enclosure system 130 (e.g., calibration substrate of the autoteach enclosure system) in some embodiments.

Transfer chamber 106 includes a transfer chamber robot 112. Transfer chamber robot 112 includes a robot arm with an end effector at an end of the robot arm. The end effector is configured to handle particular objects, such as wafers. In some embodiments, the transfer chamber robot 112 is a SCARA robot, but may have fewer links and/or fewer degrees of freedom than the factory interface robot 111 in some embodiments.

A controller 109 controls various aspects of the processing system 100. The controller 109 is and/or includes a computing device such as a personal computer, a server computer, a programmable logic controller (PLC), a microcontroller, and so on. The controller 109 includes one or more processing devices, which, in some embodiments, are general-purpose processing devices such as a microprocessor, central processing unit, or the like. More particularly, in some embodiments, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some embodiments, the processing device is one or more special-purpose processing devices such as an application specific integrated circuit (ASIC), a field programmable gate array (FPGA), a digital signal processor (DSP), network processor, or the like. In some embodiments, the controller 109 includes a data storage device (e.g., one or more disk drives and/or solid state drives), a main memory, a static memory, a network interface, and/or other components. In some embodiments, the controller 109 executes instructions to perform any one or more of the methods or processes described herein. The instructions are stored on a computer readable storage medium, which include one or more of the main memory, static memory, secondary storage and/or processing device (during execution of the instructions). The controller 109 receives signals from and sends signals to factory interface robot 111 and wafer transfer chamber robot 112 in some embodiments.

FIG. 1 schematically illustrates transfer of content 110 (e.g., a process kit ring coupled to a process kit ring carrier) into a processing chamber 107. According to one aspect of the disclosure, content 110 is removed from a process kit enclosure system 130B via factory interface robot 111 located in the factory interface 101. The factory interface robot 111 transfers the content 110 through one of the first vacuum ports 103a, 103b and into a respective degassing chamber 104a, 104b. A transfer chamber robot 112 located in the transfer chamber 106 removes the content 110 from one of the degassing chambers 104a, 104b through a second vacuum port 105a or 105b. The transfer chamber robot 112 moves the content 110 into the transfer chamber 106, where the content 110 is transferred to a processing chamber 107 though a respective port 108. While not shown for clarity in FIG. 1, transfer of the content 110 includes transfer of a process kit ring disposed on a process kit ring carrier, transfer of an empty process kit ring carrier, transfer of a placement validation wafer, etc.

FIG. 1 illustrates one example of transfer of content 110, however, other examples are also contemplated. In some examples, it is contemplated that the process kit enclosure system 130B is coupled to the transfer chamber 106 (e.g., via a load port mounted to the transfer chamber 106). From the transfer chamber 106, the content 110 is to be loaded into a processing chamber 107 by the transfer chamber robot 112. Additionally, in some embodiments, content 110 is loaded in a substrate support pedestal (SSP). In some embodiments, an additional SSP is positioned in communication with the factory interface 101 opposite the illustrated SSP. Processed content 110 (e.g., a used process kit ring) is to be removed from the processing system 100 in reverse of any manner described herein. When utilizing multiple enclosure systems 130B or a combination of enclosure system 130B and SSP, in some embodiments, one SSP or enclosure system 130B is to be used for unprocessed content 110 (e.g., new process kit rings), while another SSP or enclosure system 130B is to be used for receiving processed content 110 (e.g., used process kit rings). The enclosure system 130A is used to perform one or more of an autoteach operation, calibration operation, or diagnostic operation of a robot arm (e.g., factory interface robot 111, transfer chamber robot 112, etc.) prior to transfer of content 110 via the robot arm. The one or more of the autoteach, calibration, or diagnostic operation may enable the robot arm to correctly remove objects from specific locations in the enclosure system 130B and correctly place objects in specific locations in the enclosure system 130B (e.g., upon docking the enclosure system 130B to the same load port 128 to which the enclosure system 130A was docked).

The processing system 100 includes chambers, such as factory interface 101 (e.g., equipment front end module (EFEM)) and adjacent chambers (e.g., load port 128, enclosure system 130, SSP, degassing chamber 104 such as a loadlock, or the like) that are adjacent to the factory interface 101. One or more of the chambers is sealed (e.g., each of the chambers is sealed). The adjacent chambers are sealed to the factory interface 101. In some embodiments, inert gas (e.g., one or more of nitrogen, argon, neon, helium, krypton, or xenon) is provided into one or more of the chambers (e.g., the factory interface 101 and/or adjacent chambers) to provide one or more inert environments. In some examples, the factory interface 101 is an inert EFEM that maintains the inert environment (e.g., inert EFEM minienvironment) within the factory interface 101 so that users do not need to enter the factory interface 101 (e.g., the processing system 100 is configured for no manual access within the factory interface 101).

In some embodiments, gas flow (e.g., inert gas, nitrogen) is provided into one or more chambers (e.g., factory interface 101) of the processing system 100. In some embodiments, the gas flow is greater than leakage through the one or more chambers to maintain a positive pressure within the one or more chambers. In some embodiments, the inert gas within the factory interface 101 is recirculated. In some embodiments, a portion of the inert gas is exhausted. In some embodiments, the gas flow of non-recirculated gas into the factory interface 101 is greater than the exhausted gas flow and the gas leakage to maintain a positive pressure of inert gas within the factory interface 101. In some embodiments, the factory interface 101 is coupled to one or more valves and/or pumps to provide the gas flow into and out of the factory interface 101. A processing device (e.g., of controller 109) controls the gas flow into and out of the factory interface 101. In some embodiments, the processing device receives sensor data from one or more sensors (e.g., oxygen sensor, moisture sensor, motion sensor, door actuation sensor, temperature sensor, pressure sensor, etc.) and determines, based on the sensor data, the flow rate of inert gas flowing into and/or out of the factory interface 101.

The enclosure system 130 allows for teaching, calibrating, and/or diagnosing a robot arm (e.g., of factory interface robot) without opening the sealed environment within the factory interface 101 and adjacent chambers. Teaching, calibrating and diagnosing of a robot arm are discussed in greater detail below. The enclosure system 130 seals to the load port 128 responsive to being docked on the load port 128. The enclosure system 130 provides purge port access so that the interior of the enclosure system 130 can be purged prior to opening the enclosure system 130 to minimize disturbance of the inert environment within the factory interface 101.

Figure 2A:
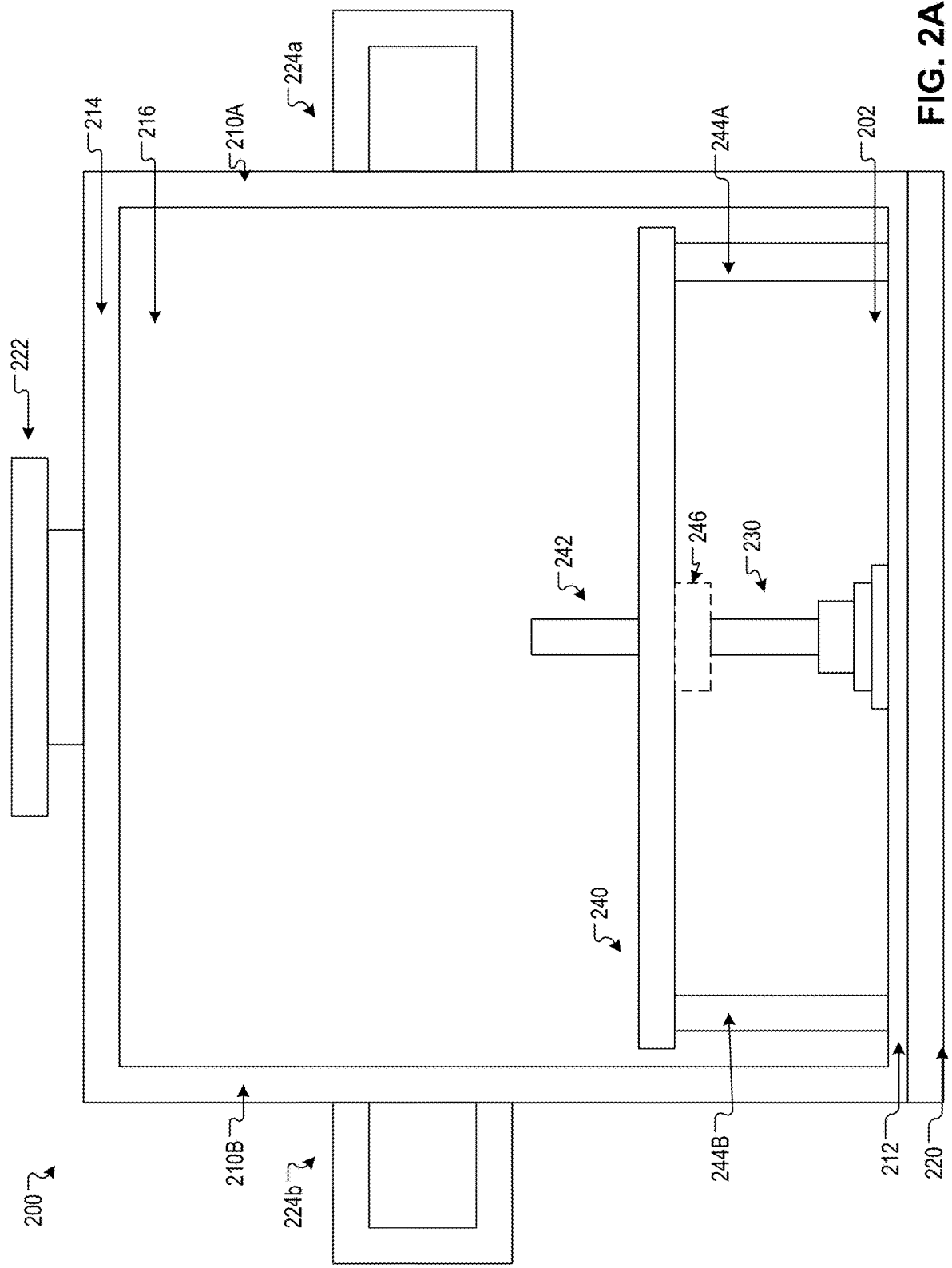
FIG. 2A illustrates a front view of an autoteach enclosure system, according to certain embodiments.

FIG. 2A illustrates a front view of an autoteach enclosure system 200 (e.g., enclosure system 130 of FIG. 1), according to certain embodiments. The autoteach enclosure system 200 is configured to enable one or more of an autoteach operation, a calibration operation, or a diagnostic operation.

The autoteach enclosure system 200 includes surfaces (e.g., walls, sidewalls, substantially planar structures, etc.) that at least partially enclose an interior volume 202 (e.g., form a cavity or chamber). In some embodiments, the interior volume 202 is a mini environment (e.g., sealed environment). In some embodiments, the interior volume 202 is kept substantially particle free (e.g., substantially uncontaminated). In some embodiments, the autoteach enclosure system 200 includes a fan (e.g., at the top surface) that suppresses any particles in the interior volume 202. In some embodiments, the interior volume is substantially devoid (or completely devoid) of one or more of moisture, oxygen, particles (e.g., dust), or the like.

The surfaces include sidewall surfaces 210A-B (e.g., sidewalls), bottom surface 212 (e.g., bottom wall), top surface 214 (e.g., top wall), and rear surface 216 (e.g., rear wall). In some embodiments, the surfaces form a clampable tub. One or more of the surfaces (e.g., sidewall surfaces 210A-B, bottom surface 212, top surface 214, etc.) form a front interface. The front interface is configured to interface with (e.g., seal to) a door for transportation of the autoteach enclosure system 200. The front interface is configured to interface (e.g., seal to) a substantially vertical portion of a load port of a wafer processing system. Responsive to the front interface being sealed to a door or the load port, the autoteach enclosure system 200 creates a sealed environment (e.g., gases and/or particles do not leave or enter the autoteach enclosure system 200 from the surrounding environment outside of the wafer processing system).

In some embodiments, the autoteach enclosure system 200 includes a baseplate 220 (e.g., adaptor plate) coupled to the bottom surface 212. The baseplate 220 is configured to interface with a horizontal portion of the load port. The baseplate 220 has features (e.g., recesses, receptacles, kinematic interface) to receive kinematic devices (e.g., kinematic pins, precision located pins) of the horizontal portion of the load port. In some embodiments the baseplate 220 is secured to the bottom surface 212 prior to interfacing the autoteach enclosure system 200 with the load port. In some embodiments, the baseplate 220 is secured to the load port and then the bottom surface 212 is secured to the baseplate 220. In some embodiments, the autoteach enclosure system 200 has a seal (e.g., crushable seal, gasket) to seal the opening in the bottom surface 212 through which the autoteach pin 230 extends.

In some embodiments, one or more of an overhead transport flange 222 or at least one handle 224 is coupled to one or more surfaces of the autoteach enclosure system 200 for transport (e.g., automated transport, manual transport, etc.) of the autoteach enclosure system 200. In some embodiments, the OHT flange 222 is coupled to the top surface 214. In some embodiments, the first handle 224A is disposed on a first sidewall surface 210A and a second handle 224B is disposed on a second sidewall surface 210B.

In some embodiments, an autoteach pin 230 is at least partially disposed within the interior volume 202. In some embodiments, the autoteach pin 230 is coupled to the baseplate 220 and at least a portion of the autoteach pin extends through an opening in the bottom surface 212 into the interior volume 202. The autoteach pin 230 enables the autoteach operation (e.g., see method 540 of FIG. 5C). In some embodiments, the autoteach pin 230 is positioned at a center of the baseplate 220.

In some embodiments, a calibration substrate 240 is disposed in the interior volume 202. The calibration substrate 240 is a flat object (e.g., wafer) that an end effector can grip and move. The calibration substrate 240 is semi-secured (e.g., a floating semi-secured calibration substrate 240) for performing sensor calibration (e.g., calibration operation)

In some embodiments, a calibration pin 242 is disposed on (e.g., secured to) an upper surface of the calibration substrate 240. In some embodiments, the calibration substrate 240 is disposed on one or more support structures 244 (e.g., on three to four support structures) in the interior volume 202. In some embodiments, the calibration substrate 240 is disposed on first and second support structures 244A-B that are disposed proximate the rear surface 216. In some embodiments, the calibration substrate 240 is disposed on support structures 244C-D proximate the front interface (e.g., in addition to the support structures 244A-B). In some embodiments, a collar 246 is disposed on the autoteach pin 230 and the calibration substrate 240 is disposed on the collar 246 (e.g., in addition to support structures 244A-B). In some embodiments, the support structures 244 are disposed on the bottom surface 212 (e.g., extend from the bottom surface 212 to the calibration substrate 240). In some embodiments, the support structures 244 are disposed on one or more of sidewall surface 210A, sidewall surface 210B, or rear surface 216. The calibration substrate 240 enables one or more of the calibration operation (e.g., see method 520 of FIG. 5B) or the diagnostic operation (e.g., see method 560 of FIG. 5D).

In some embodiments, the autoteach enclosure system 200 includes a single autoteach pin 230 (e.g., autoteach enclosure system 200 includes or does not include a calibration pin 242). Alternatively, the autoteach system 200 includes multiple autoteach pins 230. In some embodiments, the autoteach enclosure system 200 includes a single calibration pin 242 (e.g., autoteach enclosure system 200 includes or does not include an autoteach pin 230). In some embodiments, the autoteach enclosure system 200 includes an autoteach pin 230 and a calibration pin 242. In some embodiments, autoteach pin 230 and the calibration pin 242 are a single pin (e.g., a single pin can be used for both autoteach and for calibration).

In some embodiments, the autoteach enclosure system 200 includes a pin (e.g., autoteach pin 230 and/or calibration pin 242), where a shape (e.g., trapezoid) of at least a portion of the pin is configured to provide calibration and angle detection. In some examples, a trapezoidal portion of a pin provides for both calibration and angle detection and is easy to machine into a turned part. In some embodiments, the corners of the trapezoidal portion are positioned via press fit pins (e.g., the four corners could be press fit pins instead of a single machined feature) to increase precision.

In some embodiments, to provide for calibration, at least a portion of the pin has a shape (e.g., trapezoid) that has skew or asymmetries about the central pin (e.g., cylindrical portion of the pin). The symmetry of a first portion of the pin (e.g., cylindrical portion of the pin) is compared to non-symmetries of a second portion of the pin (e.g., trapezoidal portion of the pin) for calibration. The robot arm performs a movement in the z-direction (e.g., move up or down) to scan the first portion (e.g., cylindrical) and second portion (e.g., trapezoid) of the pin for comparison. The robot arm performs a rotational movement about a single joint to measure the second portion (e.g., trapezoid) from a first angle and from a second angle for comparison. The robot arm performing a movement allows for comparison of joint angles for the same approximate area without having the robot completely change joint posture to scan another object. In some embodiments, for angle detection, a set of offset features (e.g., sides or edges of a trapezoidal portion) that would increase or decrease in separation due to angle of the scan are used.

In some embodiments, an autoteach enclosure system 200 has two or more autoteach pins 230 and/or two or more calibration pins 242. In some embodiments, the autoteach enclosure system 200 includes two or more pins, where each pin can be used for one or more of autoteach and/or calibration. In some embodiments, one or more pins extend from the bottom surface 212. In some embodiments, one or more pins extend into the interior volume of the autoteach enclosure system 200 from a surface of the autoteach enclosure system 200 (e.g., sidewall surface 210A, sidewall surface 210B, top surface 214, rear surface 216, or the like). In some embodiments, one or more pins extend from a structure (e.g., calibration structure 240) within the interior volume of the autoteach enclosure system 200. In some embodiments, a first pin extends from a first structure (e.g., a first calibration structure 240A, a structure that is moveable by a robot arm) within the autoteach enclosure system 200 and a second pin extends from a second structure (e.g., a second calibration structure 240B, a structure that is moveable by a robot arm) within the autoteach enclosure system 200.

Figure 2C:
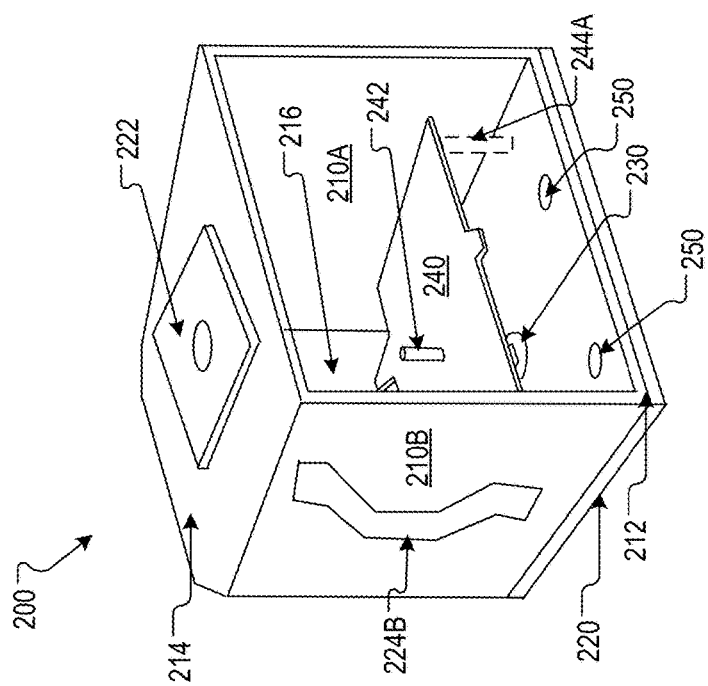
FIG. 2C illustrates a perspective view of a calibration substrate disposed in an autoteach enclosure system, according to certain embodiments.
Figure 2B:
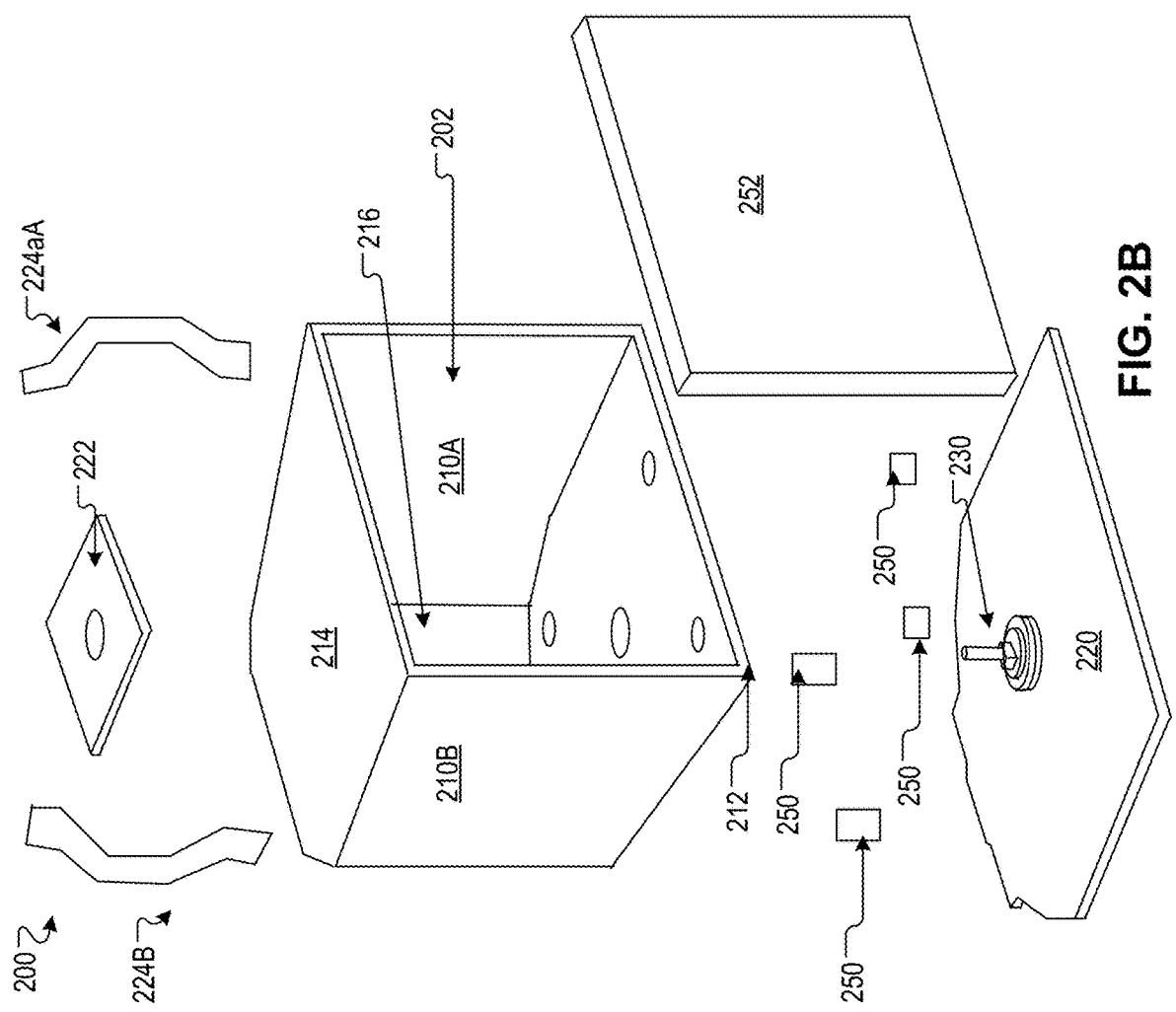
FIG. 2B illustrates an exploded perspective view of an autoteach enclosure system, according to certain embodiments.

FIG. 2B illustrates an exploded perspective view of an autoteach enclosure system 200, according to certain embodiments.

The surfaces (e.g., walls, sidewalls) of the autoteach enclosure system 200 include sidewall surfaces 210A-B, bottom surface 212, top surface 214, and rear surface 216. The autoteach enclosure system 200 includes a baseplate 220 and an autoteach pin 230 is disposed on the baseplate 220 in some embodiments. The bottom surface 212 forms one or more openings. The baseplate 220 secures to the bottom surface 212 and the autoteach pin 230 extends through an opening in the bottom surface 212 into the interior volume 202 of the autoteach enclosure system 200. The autoteach pin 230 provides a seal at the opening in the bottom surface 212 (e.g., to provide a sealed environment).

In some embodiments, one or more purge adaptors 250 are configured to insert into openings formed in the bottom surface 212. The purge adaptors 250 are used to one or more of fill the autoteach enclosure system 200 with a gas (e.g., Nitrogen (N2)), remove gas from the autoteach enclosure system, pass a gas through the autoteach enclosure system 200, or the like. Each of the purge adaptors 250 provides a seal at a corresponding opening in the bottom surface 212 (e.g., to provide a sealed environment). In some embodiments, the autoteach enclosure system 200 seals to the load port responsive to being docked to the load port. The interior volume of the autoteach enclosure system 200 is configured to be purged via the one or more purge adaptors 250 prior to opening of the autoteach enclosure system 200.

One or more of the surfaces of the autoteach enclosure system 200 provide a front interface. The autoteach enclosure system 200 includes a door 252. The door 252 seals to a front interface of the autoteach enclosure system 200 to provide a sealed environment. The door 252 interfaces with a calibration substrate (e.g., see FIG. 2C) (e.g., clamp the calibration substrate in place, compress against the calibration substrate) to prevent movement of the calibration substrate during transportation.

In some embodiments, the autoteach enclosure system 200 includes handles 224A-B and/or an OHT flange 222 for transport of the autoteach enclosure system 200.

FIG. 2C illustrates a perspective view of an autoteach enclosure system 200, according to certain embodiments.

In some embodiments, the baseplate 220 is secured to the bottom surface 212 and the autoteach pin 230 extends through the bottom surface 212 into the interior volume 202 of the autoteach enclosure system. The purge adaptors 250 are disposed in the bottom surface 212 and extend through the baseplate 220 to fluidly couple with one or more of a gas or vacuum line (e.g., for purging the autoteach enclosure system 200, for creating a vacuum in the autoteach enclosure system 200, for filling the autoteach enclosure system 200 with a gas, etc.). In some embodiments, the handle 224 and OHT flange 222 are secured to corresponding surfaces of the autoteach enclosure system 200. In some embodiments, a calibration substrate 240 is disposed on one or more support structures 244 in the interior volume 202 of the autoteach enclosure system 200. The calibration substrate 240 includes a calibration pin 242 secured to an upper surface of the calibration substrate 240. The calibration substrate 240 includes a first width in a first orientation and a second width in a second orientation. In some embodiments, the calibration substrate 240 has a notch or a recess. A first width of the calibration substrate 240 is from a first location at the perimeter to a second location at the perimeter of the calibration substrate 240 (e.g., neither of the first location or the second location includes the notch or recess) and a second width of the calibration substrate 240 is from a third location at the perimeter at the notch or recess to a fourth location at the perimeter. Responsive the third location being a recess or inward notch, the second width is shorter than the first width. The first width and second width are used to perform diagnostic operations on the robot arm (e.g., determine if the end effector can grip the calibration substrate 240 within a threshold amount of time of the first width and the second width, etc.). The calibration substrate 240 and the support structures 244 are sized to enable the calibration substrate 240 to be lifted by a robot arm (e.g., gripped by the fangs and plunger of an end effector of a robot arm) from a first location and placed in a second location on support structures 244 that is different from the first location (e.g., for determining robot arm error). The calibration pin 242 is sized and located to enable a robot arm (e.g., end effector) to scan the calibration pin 242 to determine a location of the calibration pin 242 (e.g., for determining robot arm error). The autoteach pin 230 is sized and located to enable a robot arm (e.g., end effector) to scan the autoteach pin 230 to determine a location of the autoteach pin 230 (e.g., for teaching a central location of the autoteach enclosure system 200 and/or load port).

Figure 3A:
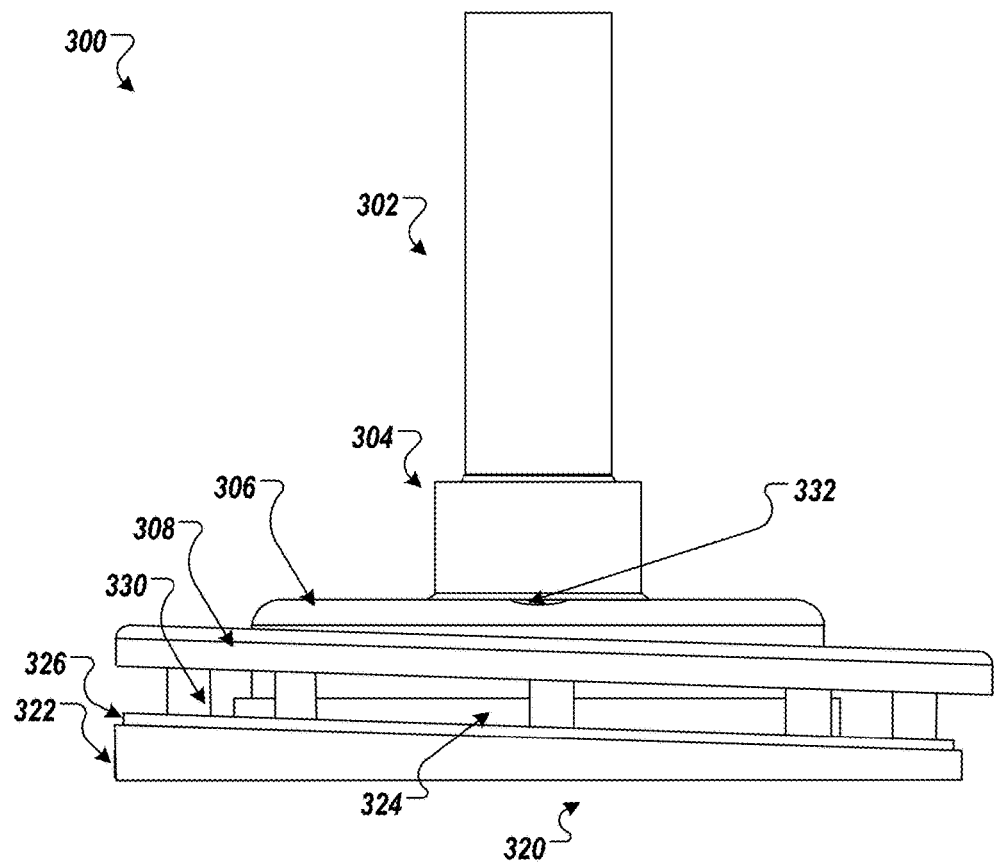
FIG. 3A illustrates a front view of an autoteach pin of an autoteach enclosure system, according to certain embodiments.
Figure 3B:
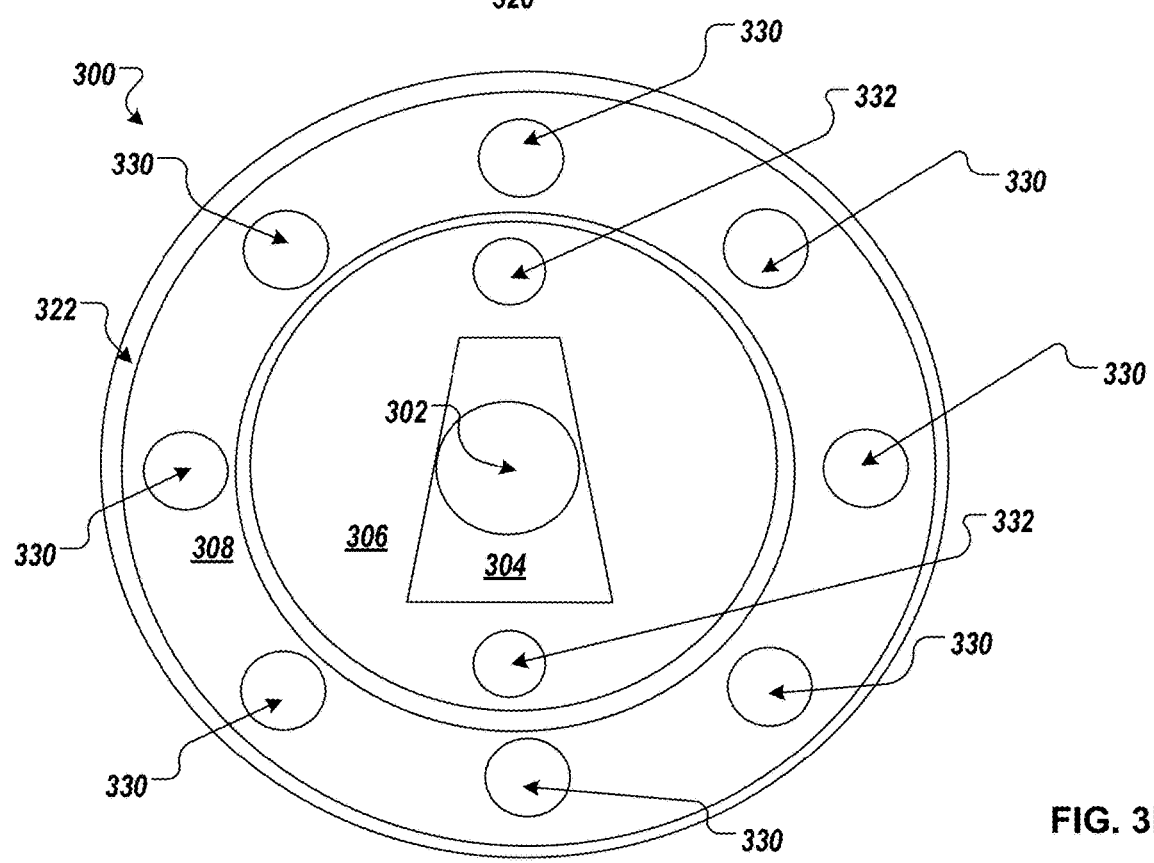
FIG. 3B illustrates a top view of an autoteach pin of an autoteach enclosure system, according to certain embodiments.

FIGS. 3A-B illustrate an autoteach pin 300 (e.g., autoteach pin 230 of FIGS. 2A-C) of an autoteach enclosure system (e.g., autoteach enclosure system 130 of FIGS. 1 and/or 200 of FIGS. 2A-C), according to certain embodiments. FIG. 3A illustrates a front view of the autoteach pin 300 and FIG. 3B illustrates a top view of the autoteach pin 300. In some embodiments, one or more portions of the calibration pin (e.g., calibration pin 242 of FIGS. 2A-C) are similar to corresponding portions of the autoteach pin 300. In some examples, the calibration pin has a cylindrical portion and a trapezoidal portion.

The autoteach pin 300 includes a cylindrical portion 302 (e.g., a first portion that has a cylindrical sidewall). The robot arm uses the cylindrical portion 302 to perform an autoteach operation to locate a fixed location (e.g., x-y location) of the autoteach enclosure system and/or the load port.

The autoteach pin 300 includes a trapezoidal portion 304 (e.g., a second portion that includes planar sidewalls). The robot arm uses the trapezoidal portion 304 to enable calibration of robot arm error. In some embodiments, the trapezoidal portion 304 has a perimeter that is an oval or a polygon (e.g., trapezoid, square, rectangle, triangle, etc.) to enable the robot arm to scan the trapezoidal portion from different angles to measure different lengths (e.g., depths) to calibrate the robot arm.

In some embodiments, the autoteach pin 300 includes a base 306 that is secured to a protruding portion 324 of the baseplate 320 (e.g., baseplate 220 of FIGS. 2A-C). One or more base fasteners (e.g., bolt, screw, etc.) couple the base 306 to the protruding portion 324 of the baseplate 320.

The bottom surface of the autoteach enclosure system includes an opening for the autoteach pin (e.g., cylindrical portion 302, trapezoidal portion 304, and base 306) and openings for clamp fasteners 330. The baseplate 320 includes a base flange 322 and a protruding portion 324. A seal 326 is disposed on the base flange 322 and the base 306 is secured to the protruding portion 324. The baseplate 320 is secured to the bottom surface of the autoteach enclosure system so that at least a portion of the autoteach pin 300 extends through an opening in the bottom surface into the interior volume of the autoteach enclosure system. In some examples, the cylindrical portion 302, trapezoidal portion 304, and at least a portion of the base 306 extend into the interior volume. In some embodiments, the base flange 322 matches the slope (e.g., non-horizontal slope) of the bottom surface of the autoteach enclosure system. The bottom surface is disposed on the seal 326 that is disposed on the base flange 322. A clamp 308 is disposed on the bottom surface around the base 306. Clamp fasteners 330 secure the clamp 308 to the base flange by extending through the clamp 308, the bottom surface, and the seal 326 to engage with the base flange 322. The base flange 322, seal 326, bottom surface, and clamp 308 are substantially parallel to each other and the clamp fasteners 330 are substantially perpendicular to the base flange 322, seal 326, bottom surface, and clamp 308.

A top surface of the cylindrical portion 302 denotes a first wafer transfer plane. A top surface of the trapezoidal portion 304 denotes an alternative wafer transfer plane. The distal end of the cylindrical portion 302 proximate the top surface of the cylindrical portion 302 is configured to support a collar for supporting the calibration substrate.

The cylindrical portion 302 has a round perimeter and has a precision controlled surface for the robot arm to scan. The diameter of the cylindrical portion 302 varies as a programmable parameter. The cylindrical portion 302 indicates an x-y center (e.g., center of the load port) relative to the kinematic devices (e.g., kinematic pins) of the load port (e.g., the substantially horizontal portion of the load port). The cylindrical portion 302 is used for an autoteach operation.

The trapezoidal portion 304 enables calibration for backlash and two additional robot linearity positions (e.g., +10 degrees and −10 degrees) to provide a total of six scannable positions. The trapezoidal portion 304 is used for backlash calibration of specific joints on the robot arm. The trapezoidal portion 304 provides different depths of scan if approached from different angles. The trapezoidal portion allows isolation of backlash (e.g., general error in a joint) in individual joints.

Figure 4A:
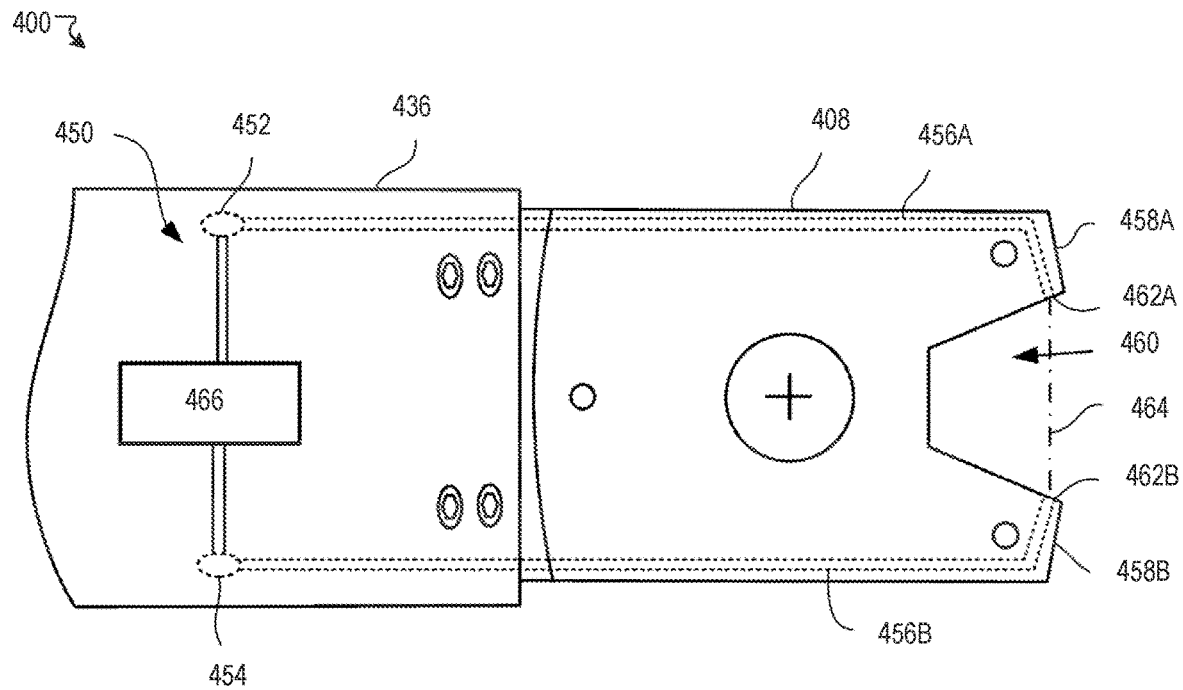
FIG. 4A illustrates a top view of a robot arm, according to certain embodiments.

FIG. 4A illustrates a top view of a robot arm 400, according to certain embodiments. The robot arm 400 is configured to perform one or more of an autoteach operation, a calibration operation, or a diagnostic operation using an autoteach enclosure system. The robot arm 400 includes an end effector 408, a wrist member 436, a beam sensor 450, a light source 452, and a light receiver 454. A light transmitting fiber 456A is routed through the wrist member 436 and the end effector 408 and terminates at a first end 458A of the end effector 408. A light receiving fiber 456B is routed through the wrist member 436 and the end effector 408 and terminates at a second end 458B of the end effector 408. The first end 458A and the second end 458B of the end effector 408 are spaced apart across a gap 460 that forms a relief region for certain types of processing including detecting a peripheral edge of a substrate, an autoteach pin, a calibration pin, or the like.

The light transmitting fiber 456A terminates at a first light path opening 462A proximate the first end 458A. Similarly, the light receiving fiber 456B terminates at a second light path opening 462B proximate the second end 458B. The first light path opening 462A and the second light path opening 462B face each other and form a light transmission path 464 (e.g., a light beam) for detecting the presence or absence of a peripheral edge of an object (e.g., autoteach pin, calibration pin, a substrate, etc.). The light transmission path 464 extends between the first end 458A and the second end 458B (e.g., between two points), which enables detection of objects in the gap 460.

The beam sensor 450 further includes a light transmitting/receiving module 466 that detects degrees of light transmission between the light transmitting fiber 456A and the light receiving fiber 456B. The light transmitting/receiving module 466 senses a peripheral edge of an object located between the first light path opening 462A and the second light path opening 462B responsive to the object blocking the light transmission path 464. An output signal generated by the light transmitting/receiving module 466 is provided to a controller via conductors passing through the robot arm 400.

During operation of the robot arm 400, the controller (e.g., controller 109 of FIG. 1) transmits signals to the robot arm 400 that cause the end effector 408 to move to certain locations. In some examples, the controller generates signals causing one or more portions of the robot arm (e.g., the upper arm, the forearm, the wrist member 436) to move to specific locations, such as locations within a factory interface or transfer chamber of the wafer processing system. The controller generates signals to move the end effector 408 based on a fixed location relative to the robot arm 400. For example, the robot arm 400 performs the autoteach operation (e.g., where the robot arm 400 determines the coordinates of the fixed location), calibration operation (e.g., where the robot arm 400 determines robot arm error of the robot arm 400), and/or diagnostic operation (e.g., where the robot arm 400 determines an error or malfunction in the robot arm 400). The controller then generate signals to move one or more portions of the robot arm 400 (e.g., the upper arm, the forearm, the wrist member 436) to move the end effector 408 to specific locations that are relative to the fixed location (e.g., in view of the robot arm error, etc.).

In some embodiments, one or more errors in the mechanics of the robot arm 400 cause errors in positioning the end effector 408. For example, one or more joints (e.g., between the upper arm, the forearm, the wrist member 436) have errors or play, which contribute to position errors. These position errors reduce the accuracy of the autoteach operation performed by the robot arm 400. The errors in the one or more joints include joint kinematic errors, joint hysteresis, and joint backlash. The joint kinematic errors (e.g., joint error) are the results of joints not rotating as they are instructed. For example, a joint is instructed to rotate to a specific angle, but the joint rotates to a different angle. Joint backlash occurs when a joint is rotated clockwise or counterclockwise and a repeatable difference in position occurs. Joint hysteresis relates to hysteresis observed in clockwise and counterclockwise rotation of the joints. Other errors that are analyzed include the actual lengths of one or more portions of the robot arm (e.g., the upper arm, the forearm, the wrist member 436) verses their lengths that are stored in the controller.

Autoteach accuracy is improved by repeatedly orienting the end effector 408 to a fixed location using different robot postures. A robot posture refers to positions of one or more portions of the robot arm (e.g., the upper arm, the forearm, the wrist member 436). The robot arm 400 determines different coordinates of the fixed location, which vary due to robot arm errors (e.g., the joint errors and other errors).

Figure 4B:
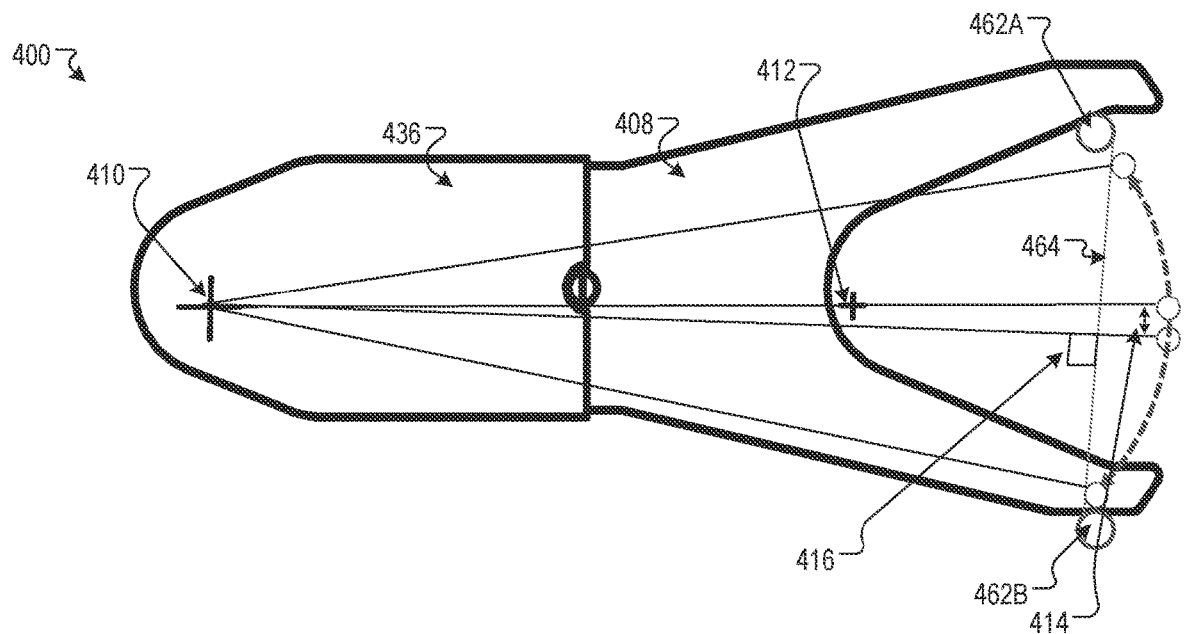
FIG. 4B illustrates a top view of a robot arm, according to certain embodiments.

FIG. 4B illustrates a top view of a robot arm 400, according to certain embodiments. The robot arm 400 is configured to perform one or more of an autoteach operation, a calibration operation, or a diagnostic operation using an autoteach enclosure system. The robot arm 400 includes an end effector 408, a wrist member 436, a first light path opening 462A (e.g., fiber emitter) coupled to a light source 452, and a second light path opening 462B (e.g., fiber receiver) coupled to a light receiver 454. A light transmission path 464 (e.g., light beam, beam triggering path) is disposed between the first light path opening 462A and the second light path opening 462B.

The robot arm 400 has a robot wrist center 410 that corresponds to an actual wafer center 412. A characteristic error 414 (e.g., robot arm error) of the robot arm 400 is the distance or angle between a center line and an error line. The center line is between the robot wrist center 410 and actual wafer center 412. The error line is perpendicular (e.g., at a 90 degree angle 416) to the light transmission path 464. In some embodiments, the robot arm 400 determines the characteristic error 414 via a calibration operation.

Figure 4C:
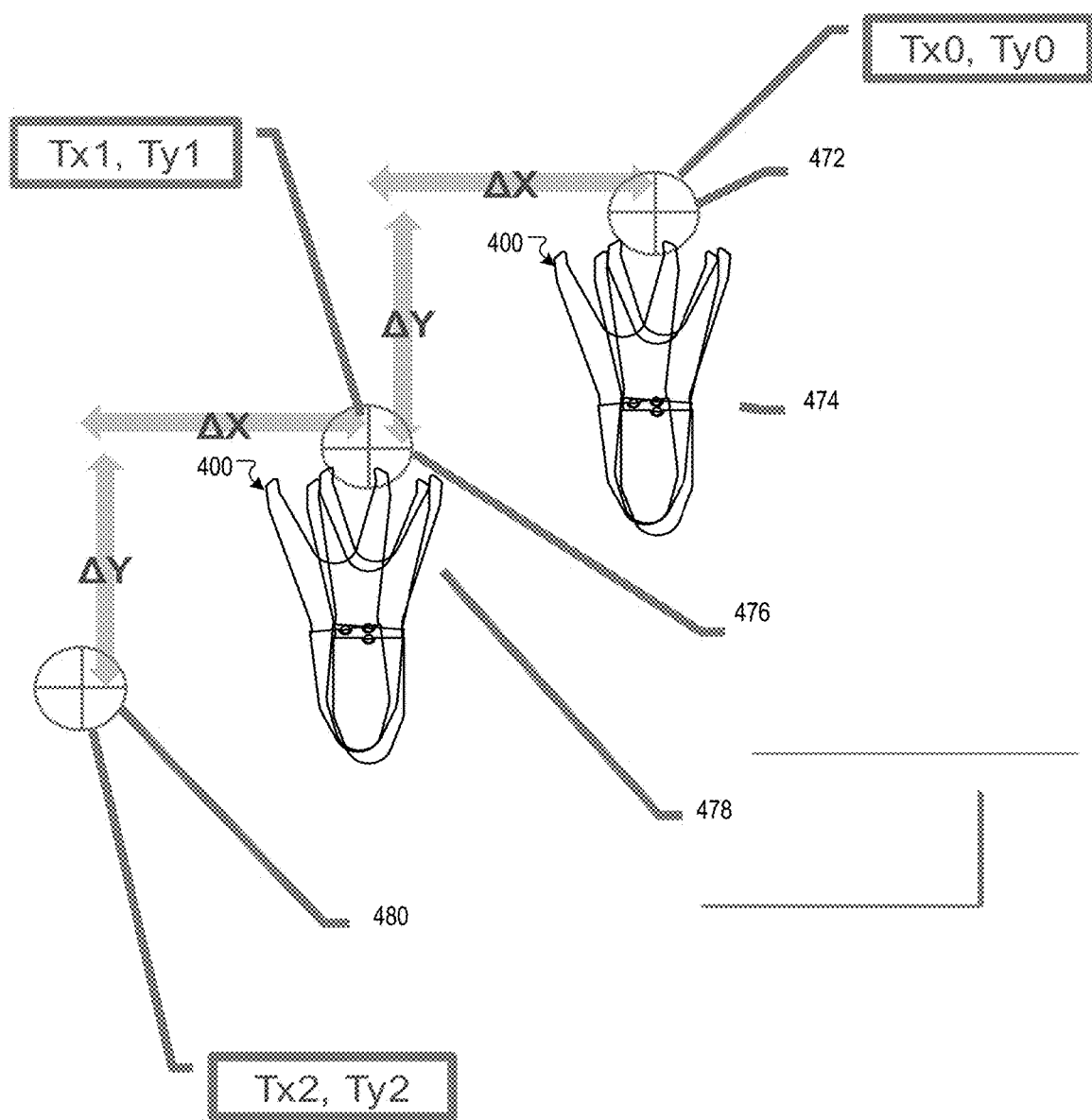
FIG. 4C illustrates a method of using an autoteach enclosure system to perform a calibration operation, according to certain embodiments.

FIG. 4C illustrates a method 470 of using an autoteach enclosure system to perform a calibration operation, according to certain embodiments. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

Referring to method 470 of FIG. 4C, at block 472, the robot arm 400 places a calibration substrate that includes a calibration pin (e.g., pinned wafer) at a first location (e.g., Tx0, Ty0) on support structures in the autoteach enclosure system (e.g., responsive to the autoteach enclosure system being docked and sealed to a load port). In some embodiments, the calibration substrate is placed at the first location prior to the autoteach enclosure system being docked.

At block 474, the robot arm 400 performs a first scan (e.g., autoteach scan) of the calibration pin in the autoteach enclosure system. The robot arm 400 determines the calibration pin is at the first location. To perform a scan, the robot arm 400 rotates to the left and right about a wrist center 410.

At block 476, the robot arm 400 lifts up the calibration substrate and is directed to move the calibration substrate to a second location (e.g., Tx1, Ty1) on the support structures in the autoteach enclosure system. In some embodiments, the second location is the same as the first location. In some embodiments, the second location is different from the first location.

At block 478, the robot arm 400 performs a second scan (e.g., autoteach scan) to determine, at block 480, the calibration pin is at a third location (e.g., Tx2, Ty2) in the autoteach enclosure system. To perform a scan, the robot arm 400 rotates to the left and right about a wrist center 410.

The robot arm 400 determines a robot arm error based on two or more of the first location, the second location, or the third location. In an example, the robot arm error is the difference between the third location (e.g., actual location) and the second location (e.g., the directed location). Accordingly, the robot arm uses the robot arm error to determine actual locations of objects.

In some embodiments, the robot arm performs the method 470 for each member of the robot arm (e.g., the wrist member, the upper arm, the forearm) to determine the robot arm error for each member of the robot arm. In some examples, the robot arm performs the method 470 by rotating a forearm center of the forearm while maintaining other members stationary to determine a robot arm error specific to the forearm.

FIGS. 5A-D illustrate methods of using an autoteach enclosure system to perform one or more of an autoteach operation, calibration operation, or diagnostic operation (e.g., while maintaining a sealed environment), according to certain embodiments. One or more of autoteach operation, calibration operation, or diagnostic operation are automatically performed responsive to user input (e.g., pushing a button on the factory interface). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

Figure 5A:
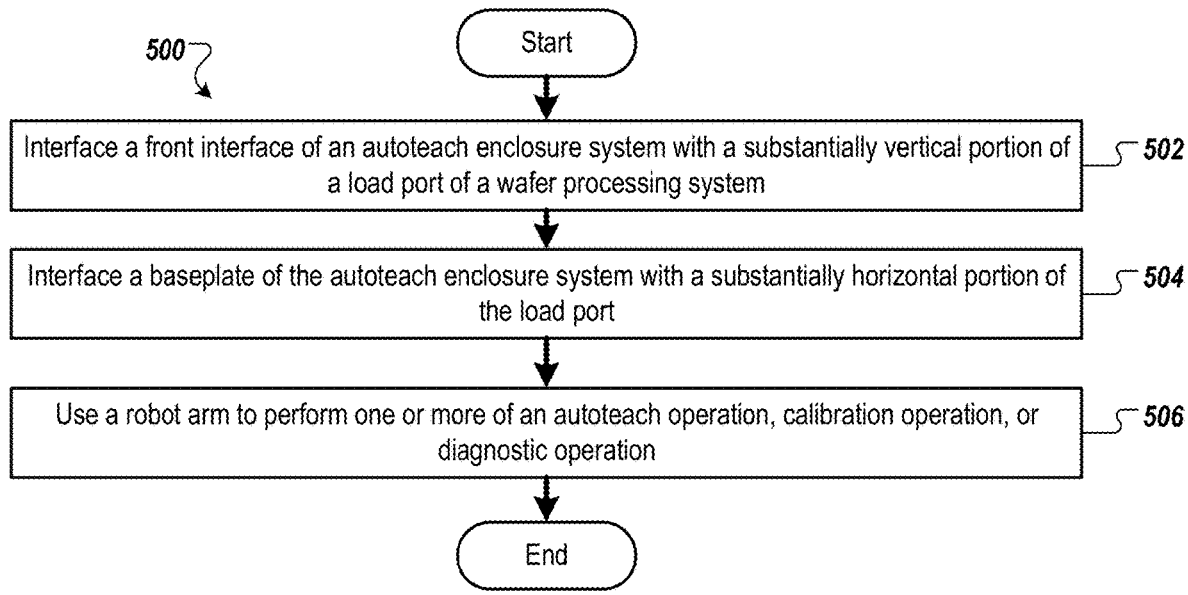
FIGS. 5A-D illustrate methods of using an autoteach enclosure system to perform one or more of an autoteach operation, calibration operation, or diagnostic operation, according to certain embodiments.

Referring to method 500 of FIG. 5A, at block 502, a front interface of an autoteach enclosure system interfaces with a substantially vertical portion of a load port of a wafer processing system. The front interface seals to the substantially vertically portion of the load port. In some examples, the front interface is clamped to the substantially vertical portion of the load port and a sealing member (e.g., gasket) is disposed between the front interface and the substantially vertical portion of the load port.

At block 504, a baseplate of the autoteach enclosure system interfaces with a substantially horizontal portion of the load port. The baseplate includes features (e.g., recesses or receptacles) that interface with kinematic devices (e.g., kinematic pins) of the substantially horizontal portion of the load port. The features (e.g., cones) of the baseplate interface with the kinematic features (e.g., kinematic pins) of the load port to dispose the autoteach enclosure system in a specific location relative to the load port. The kinematic features of the load port interface with features of other enclosure systems (e.g., process kit ring enclosure systems) to dispose the other enclosure systems in the same specific location relative to the load port as the autoteach enclosure system.

Figure 5B:
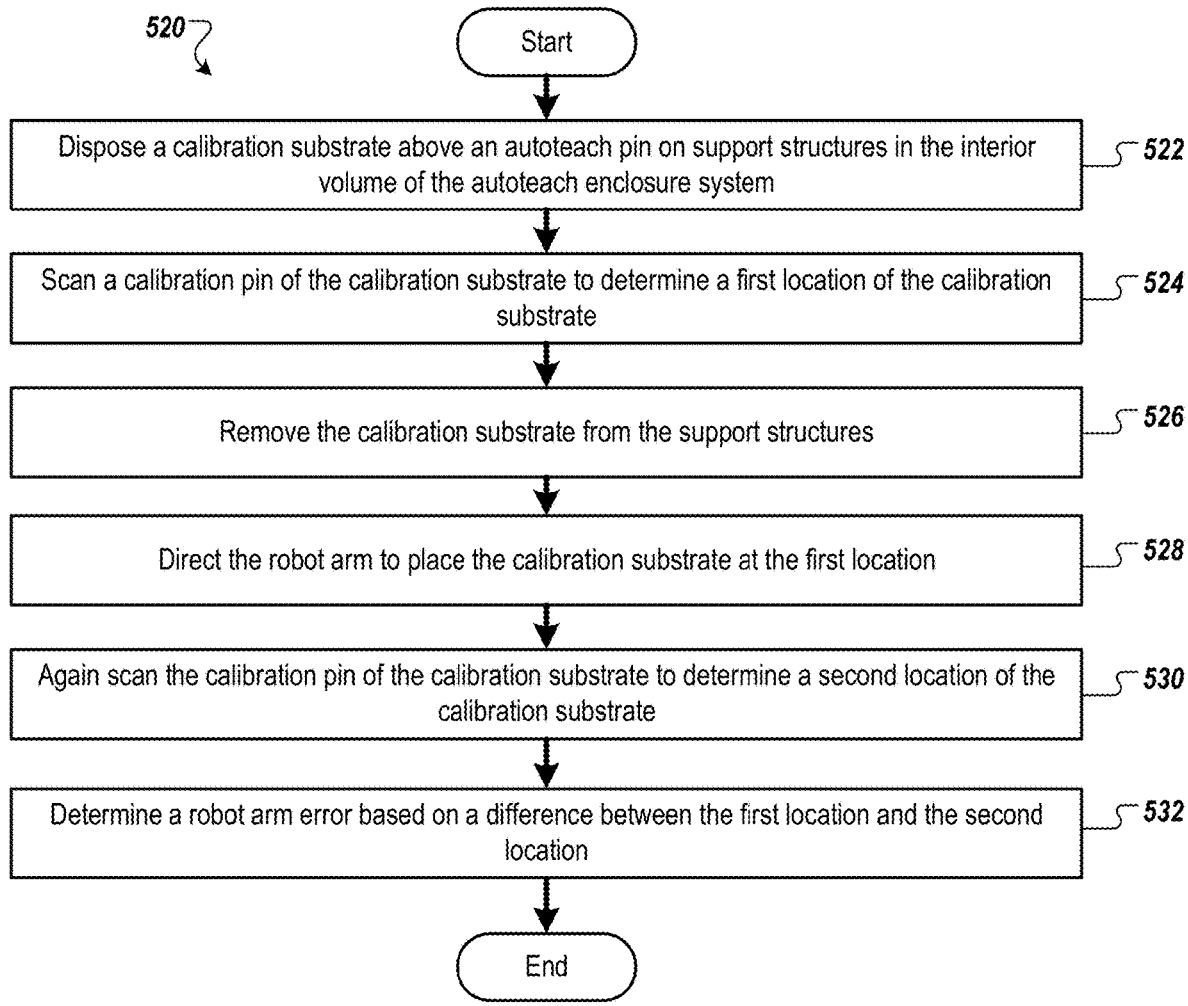
Figure 5C:
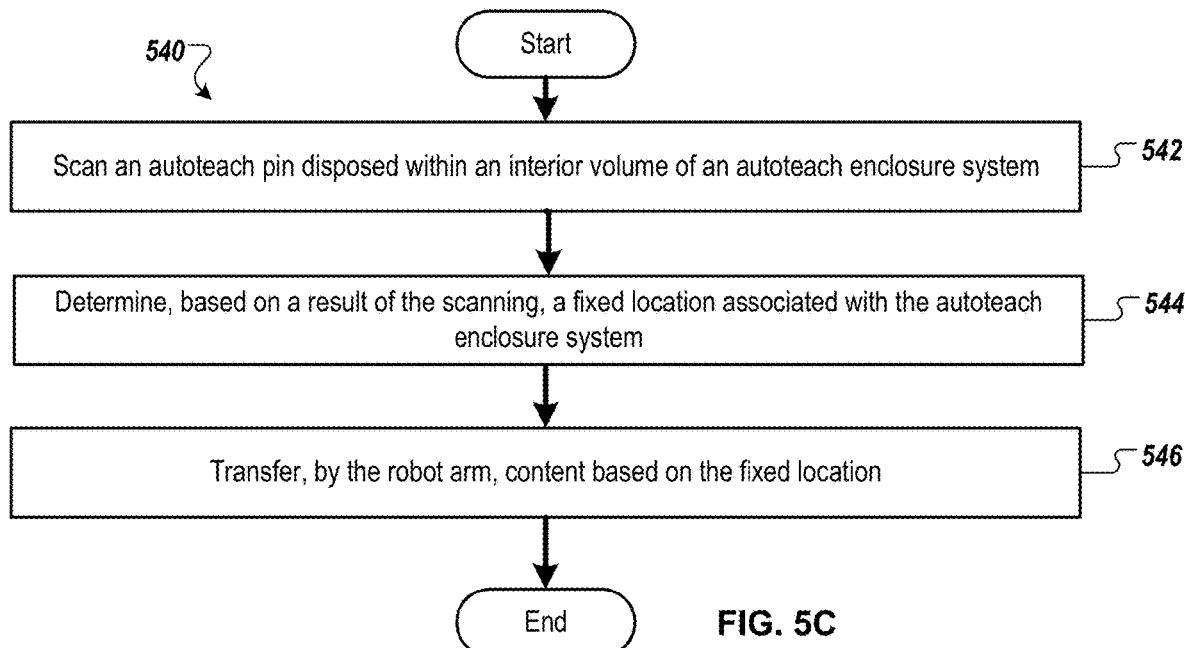
Figure 5D:
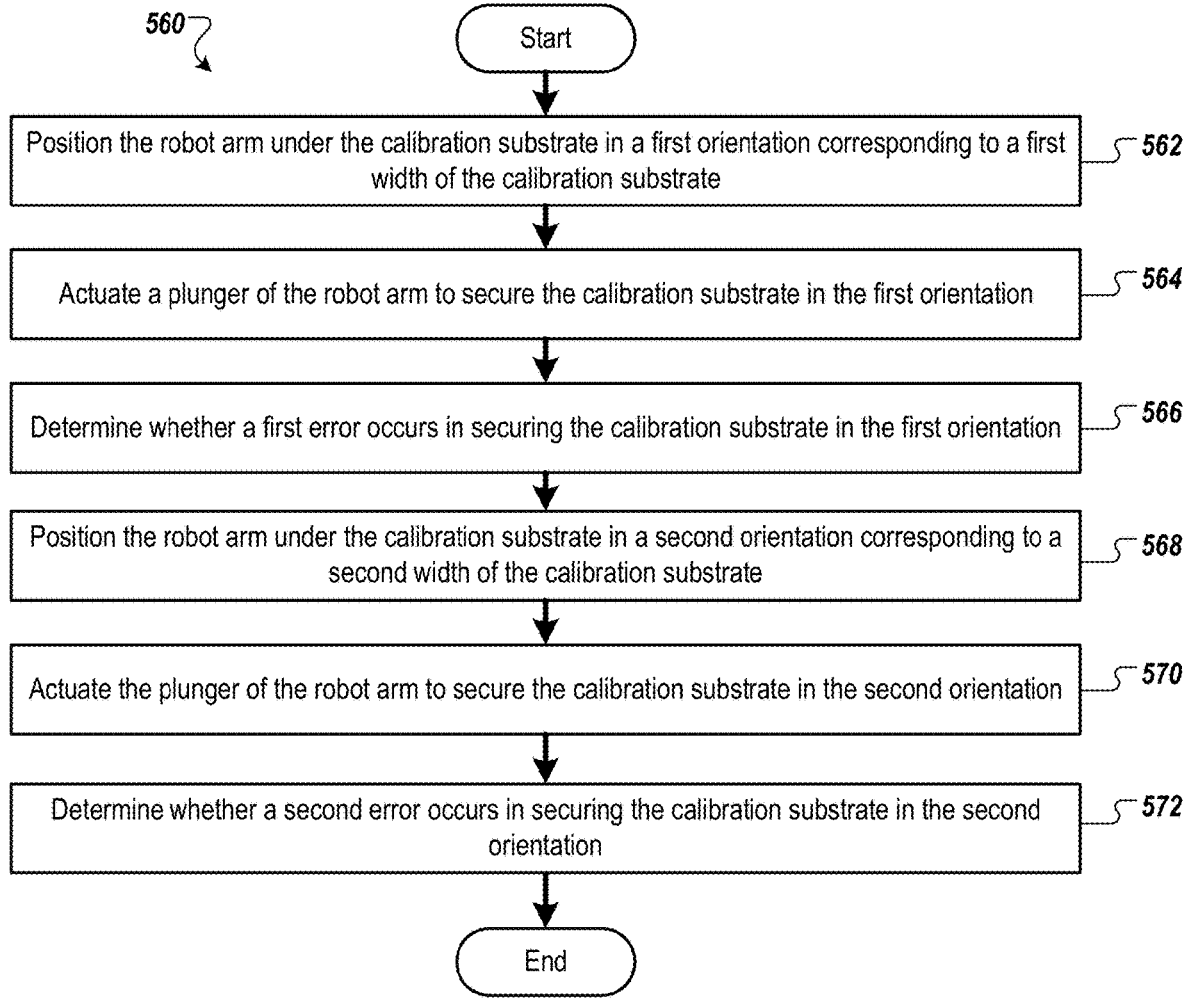

At block 506, a robot arm is used to perform one or more of an autoteach operation (e.g., see method 540 of FIG. 5C), a calibration operation (e.g., see method 520 of FIG. 5B), or a diagnostic operation (e.g., see method 560 of FIG. 5D).

In some embodiments, the autoteach operation is used to teach the robot arm a fixed location (e.g., center of enclosure systems or the load port in an x-y plane) so that the robot arm can be positioned below the center of each wafer during pickup operations and to transfer each wafer to the correct location in a placement (e.g., drop-off) operation.

In some embodiments, the calibration operation is used to determine error in movement of a robot arm and to compensate for that error. For example, responsive to determining a wrist of a robot arm rotates a first amount of degrees less than the instructed amount of degrees, the controller is to direct the wrist to rotate the sum of the first amount of degrees and the instructed amount of degrees (e.g., to compensate for the rotation error, such as a 1-degree error in rotation of a wrist of the robot arm).

In some embodiments, the diagnosis operation is used to determine whether a component of the robot arm is functioning properly (e.g., proper speed, proper measurements, proper securing of wafers, etc.).

Each of the autoteach operation, the calibration operation, and the diagnosis operation are to be performed with the autoteach enclosure system without opening the factory interface.

FIG. 5B illustrates a method 520 of using an autoteach enclosure system to perform a calibration operation (e.g., while maintaining a sealed environment), according to certain embodiments. In some embodiments, a calibration operation is performed one or more of at the factory, after replacement of one or more parts of the robot arm (e.g., controller, member, joint, etc.), after manipulation of one or more portions of the robot arm, after damage to the robot arm, upon loosing previous robot arm error data (e.g., obtained from the factory), or the like. The calibration operation provides a robot joint error of the robot arm that is not specific to any specific station (e.g., is applicable to the robot arm at any load port of the wafer manufacturing system).

Referring to method 520 of FIG. 5B, at block 522, a calibration substrate is disposed above an autoteach pin on support structures in the interior volume of the autoteach enclosure system.

At block 524, the robot arm scans a calibration pin of the calibration substrate to determine a first location of the calibration substrate. The robot arm scans the calibration pin by moving to the left and right about a center of a member of the robot arm (e.g., about the wrist center). The robot arm scans the calibration pin by moving only one member (e.g., wrist member) of the robot arm and keeping other members of the robot arm stationary. The robot arm stores the first location.

At block 526, the robot arm removes the calibration substrate from the support structures. The robot arm causes the end effector of the robot arm to be disposed under the calibration substrate. The robot arm actuates the plunger (e.g., pneumatic plunger) of the end effector to grip the calibration substrate between the plunger and the pads (e.g., fangs) at the distal ends of the end effector. In some embodiments, the robot arm lifts the calibration substrate and moves the calibration substrate using only one member of the robot arm while keeping the other members of the robot arm stationary. In some embodiments, the robot arm removes the calibration substrate from the autoteach enclosure system.

At block 528, the robot arm is directed to place the calibration substrate at the first location. The robot arm retrieves the first location from memory and attempt to place the calibration substrate at the first location. The robot arm uses the same member of the robot arm (e.g., wrist member) that was used to remove the calibration substrate from the support structures (e.g., to isolate the determined robot arm error to one member).

At block 530, the robot arm again scans the calibration pin of the calibration substrate to determine a second location of the calibration substrate.

At block 532, a robot arm error is determined based on a difference between the first location and the second location. The robot arm error is used for any operations of the enclosure system (e.g., autoteach operation, calibration operation of other member of the robot arm, diagnostic operation, etc.) and/or operations of other enclosure systems (e.g., transfer of wafers, carriers, process kit rings, placement validation wafers, etc.) that are later docked at the same load port as the autoteach enclosure system.

FIG. 5C illustrates a method 540 of using an autoteach enclosure system to perform an autoteach operation (e.g., while maintaining a sealed environment), according to certain embodiments. In some embodiments, an autoteach operation is performed one or more of at startup (e.g., of a tool of the wafer manufacturing system), periodically (e.g., once a year), upon drifting of values received from the robot arm, as the robot arm ages, after replacing a part of the robot arm, etc. The autoteach operation provides a specific location of the autoteach enclosure system and/or load port. The specific location is used by the robot arm to determine location of objects in any enclosure system that is mounted on the same load port.

Referring to method 540 of FIG. 5C, at block 542 the robot arm scans an autoteach pin disposed within an interior volume of the autoteach enclosure system. In some embodiments, the robot arm scans the autoteach pin by moving only one member (e.g., wrist member) of the robot arm and keeping other members of the robot arm stationary. In some embodiments, the robot arm uses the same member that was used in the calibration operation.

At block 544, a fixed location (e.g., center location) associated with the autoteach enclosure system and/or load port is determined based on a result of the scanning of block 542. In some embodiments, the fixed location is further determined based on the robot arm error.

At block 546, the robot arm is caused to transfer content based on the fixed location. In some embodiments, the robot arm transfers content based on the robot error. The robot arm uses the fixed location for any operations of the enclosure system (e.g., calibration operation of other member of the robot arm, diagnostic operation, etc.) and/or operations of other enclosure systems (e.g., transfer of wafers, carriers, process kit rings, placement validation wafers, etc.) that are later docked at the same load port as the autoteach enclosure system.

FIG. 5D illustrates a method 560 of using an autoteach enclosure system to perform a diagnostic operation (e.g., while maintaining a sealed environment), according to certain embodiments. In some embodiments, a diagnostic operation is performed one or more of periodically (e.g., daily, weekly, monthly), as the robot arm ages, as problems are detected with the robot arm and/or wafer handled by the robot arm, to perform statistical process control (SPC) tracking on the robot arm to know in advance if the robot arm is going bad to plan down time, or the like. The diagnostic operation may be performed to determine if any component of the robot arm is malfunctioning.

Referring to method 560 of FIG. 5D, at block 562 the robot arm is positioned under the calibration substrate in a first orientation corresponding to a first width of the calibration substrate. In some embodiments, the end effector of the robot arm is positioned under the calibration substrate. The end effector has a planar upper surface and one or more distal ends opposite a wrist of the robot arm. The one or more distal ends each have a corresponding protrusion (e.g., fang) that extends upwards from the planar surface. The end effector has a plunger disposed above the planar upper surface. The upper planar surface is configured to support a substrate. The plunger is configured to be actuated to push against one side of the substrate while the protrusions (e.g., fangs) push against other sides of the substrate so that the substrate is gripped (e.g., secured) between the plunger and the protrusions. While securing the substrate via the end effector, the robot arm can transport the substrate.

At block 564, a plunger of the robot arm is directed to actuate to secure the calibration substrate in the first orientation. To secure the calibration substrate, the calibration substrate is secured between pads (e.g., fangs) at distal ends of the end effector and the plunger.

At block 566, occurrence of a first error in securing the calibration substrate in the first orientation is determined. The robot arm may actuate the plunger until the sooner of a threshold amount of time or determining that a substrate is secured between the plunger and the pads (e.g., a sensor determines a threshold amount of resistance to the actuating of the plunger). This may be responsive to determining a distance between a distal end of the plunger and the pads. For example, a distance between the plunger and pads may correspond to each position of actuation of the plunger.

In some embodiments, the determining of the first error is responsive to determining that the substrate is not secured between the plunger and the pads within a threshold amount of time of actuation of the plunger (e.g., threshold amount of resistance is not detected within a threshold amount of time). This may indicate that the plunger is malfunctioning by not actuating or by actuating below a threshold speed.

In some embodiments, the determining of the first error is responsive to determining that the plunger has actuated less than a threshold distance to secure the calibration substrate (e.g., resulting in a measured width that is less than an actual width). This may indicate that the plunger is malfunctioning by actuating less than a distance that it was directed to actuate.

In some embodiments, the determining of the first error is responsive to determining that a measured width of the calibration substrate in the first orientation is different than the actual width of the calibration substrate in the first orientation. This may indicate that the plunger is malfunctioning by not actuating as much as it is being directed to actuate or by not properly securing the calibration substrate.

In some embodiments, the first error is responsive to the calibration substrate not being seated properly on the robot arm (e.g., one or more portions being popped up on the fangs of the end effector), wear of the end effector, or the like.

At block 568, the robot arm is positioned under the calibration substrate in a second orientation corresponding to a second width of the calibration substrate that is different from the first width. One of the first orientation or the second orientation corresponds to a feature (e.g., notch, recess) in the perimeter of the calibration substrate.

At block 570, the plunger of the robot arm is actuated to secure the calibration substrate in the second orientation. In some embodiments, block 570 is similar to block 564.

At block 572, occurrence of a second error in securing the calibration substrate in the second orientation is determined. In some embodiments, block 572 is similar to block 566. In some embodiments, occurrence of an error is determined for one of the first orientation or the second orientation (e.g., and the other of the first orientation or the second orientation does not have an error).

Figure 6:
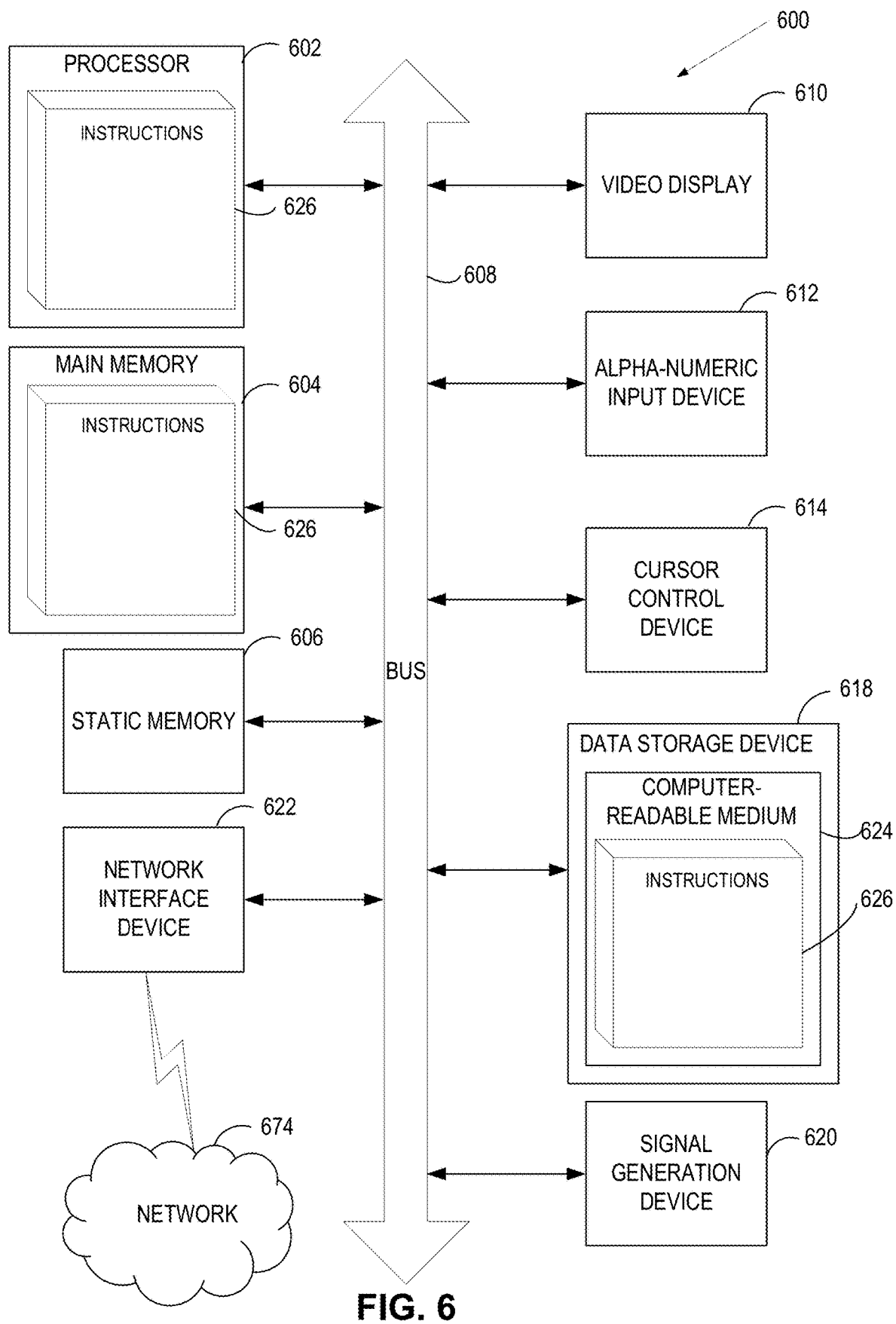
FIG. 6 is a block diagram illustrating a computer system, according to certain embodiments.

FIG. 6 is a block diagram illustrating a computer system 600, according to certain embodiments. In some embodiments, computer system 600 is controller 109 (e.g., see FIG. 1). Computer system 600 (e.g., processing device 602) is used to cause the robot arm to perform the autoteach operation, calibration operation, and/or diagnostic operation.

In some embodiments, computer system 600 is connected (e.g., via a network, such as a Local Area Network (LAN), an intranet, an extranet, or the Internet) to other computer systems. Computer system 600 operates in the capacity of a server or a client computer in a client-server environment, or as a peer computer in a peer-to-peer or distributed network environment. Computer system 600 is provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 includes a processing device 602, a volatile memory 604 (e.g., random access memory (RAM)), a non-volatile memory 606 (e.g., read-only memory (ROM) or electrically-erasable programmable ROM (EEPROM)), and a data storage device 618, which communicates with each other via a bus 608.

Processing device 602 is provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 600 further includes a network interface device 622 (e.g., that communicates via network 674). Computer system 600 also includes a video display unit 610 (e.g., an LCD), an alphanumeric input device 612 (e.g., a keyboard), a cursor control device 614 (e.g., a mouse), and a signal generation device 620.

In some implementations, data storage device 618 includes a non-transitory computer-readable storage medium 624 on which stores instructions 626 encoding any one or more of the methods or functions described herein, including instructions for implementing methods described herein (e.g., causing the robot arm to perform the autoteach operation, causing the robot arm to perform a calibration operation, causing the robot arm to perform a diagnostic operation, and/or performing method 470 of FIG. 4C).

Instructions 626 also resides, completely or partially, within volatile memory 604 and/or within processing device 602 during execution thereof by computer system 600, hence, volatile memory 604 and processing device 602 also constitutes machine-readable storage media in some embodiments.

While computer-readable storage medium 624 is shown in the illustrative examples as a single medium, the term "non-transitory computer-readable storage medium" shall include a single medium or multiple media (e.g., a centralized or distributed database, and/or associated caches and servers) that store the one or more sets of executable instructions. The term "non-transitory computer-readable storage medium" shall also include any tangible medium that is capable of storing or encoding a set of instructions for execution by a computer that cause the computer to perform any one or more of the methods described herein. The term "non-transitory computer-readable storage medium" shall include, but not be limited to, solid-state memories, optical media, and magnetic media.

In some embodiments, methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. Further, in some embodiments, the methods, components, and features are implemented in any combination of hardware devices and computer program components, or in computer programs.

Unless specifically stated otherwise, terms such as "scanning," "moving," "causing," "performing," "removing," "placing," "directing," "determining," "disposing," "actuating," "locating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. In some embodiments, this apparatus is specially constructed for performing the methods described herein, or it includes a general purpose computer system selectively programmed by a computer program stored in the computer system. In some embodiments, such a computer program is stored in a computer-readable tangible storage medium.

The methods and illustrative examples described herein are not inherently related to any particular computer or other apparatus. Various general purpose systems can be used in accordance with the teachings described herein, or a more specialized apparatus can be constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +10%.

Although the operations of the methods herein are shown and described in a particular order, the order of operations of each method can be altered so that certain operations are performed in an inverse order so that certain operations are performed, at least in part, concurrently with other operations. In another embodiment, instructions or sub-operations of distinct operations are in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An autoteach system of a wafer processing system, the autoteach system comprising:
   an autoteach pin that is a scannable feature having a fixed position within the autoteach system, wherein the autoteach pin enables an autoteach operation of a robot arm of the wafer processing system, wherein an end effector of the robot arm is to scan the autoteach pin to perform the autoteach operation of the robot arm, wherein the autoteach operation is an operation to automatically teach the fixed position within the autoteach system to the robot arm of the wafer processing system, wherein the autoteach pin comprises:
   a first portion comprising a cylindrical sidewall, wherein the robot arm is to use the first portion to locate the fixed position within the autoteach system; and
   a second portion comprising planar sidewalls, wherein the robot arm is to scan the second portion to perform a first calibration of robot arm error.

2. The autoteach system of claim 1, wherein the first portion is disposed above the second portion.

3. The autoteach system of claim 1, wherein the first portion has a circular perimeter, and wherein the second portion has a perimeter that is one or more of a trapezoid, oval, polygon, square, rectangle, or triangle.

4. The autoteach system of claim 1, wherein a central axis of the first portion passes through a center of a circular perimeter of the first portion, and wherein the second portion has a perimeter that is asymmetrical about the central axis of the first portion.

5. The autoteach system of claim 1, wherein symmetry of the first portion is to be compared to asymmetry of the second portion to perform the first calibration of the robot arm error.

6. The autoteach system of claim 1, wherein the robot arm is to move in a z-direction to scan the first portion and the second portion, and wherein the robot arm is to perform a rotational movement about a single joint to measure the second portion from a plurality of angles to perform the first calibration of the robot arm error.

7. The autoteach system of claim 1, wherein a top distal end of the first portion is configured to support a collar to support a calibration substrate, and wherein the calibration substrate is to be lifted by the robot arm.

8. The autoteach system of claim 1, wherein the autoteach pin comprises a base that is secured to a protruding portion of a baseplate, and wherein one or more base fasteners couple the base to the protruding portion of the baseplate.

9. The autoteach system of claim 1, wherein the robot arm is to scan the second portion from different angles to determine a plurality of measurements of the second portion to perform the first calibration of the robot arm.

10. The autoteach system of claim 1 further comprising:
    a calibration substrate configured to be disposed on a plurality of support structures of the wafer processing system, the calibration substrate comprising a calibration pin, wherein the calibration substrate enables a second calibration of the robot arm error of the robot arm of the wafer processing system to automatically determine the robot arm error of the robot arm.

11. The autoteach system of claim 10, wherein the calibration substrate comprises a substantially horizontal structure that is configured to be disposed on support structures, and wherein the calibration pin is attached to an upper surface of the substantially horizontal structure.

12. The autoteach system of claim 10, wherein:
    the calibration pin is to be scanned by the robot arm;

the calibration substrate is to be lifted from a first location by the robot arm subsequent to the calibration pin being scanned;

the calibration substrate is to be placed at a second location by the robot arm responsive to the robot arm lifting the calibration substrate;

the calibration pin is to be re-scanned by the robot arm responsive to the calibration substrate being placed on the support structures; and the robot arm error is to be determined based on a difference between the first location and the second location.

13. The autoteach system of claim 10, wherein the autoteach pin is disposed below the calibration pin.

14. The autoteach system of claim 13 further comprising a collar disposed on the autoteach pin, wherein the calibration substrate is disposed on the collar.

15. The autoteach system of claim 10, wherein the calibration substrate is configured to enable a diagnostic operation of the robot arm to determine whether a first error occurs in securing the calibration substrate.

16. The autoteach system of claim 15, wherein the first error is based on whether the end effector of the robot arm grips the calibration substrate within a threshold amount of time.

17. The autoteach system of claim 15, wherein the calibration substrate has a first width in a first orientation and a second width in a second orientation, wherein the first width is different from the second width, and wherein the first error is based on whether the end effector of the robot arm grips the calibration substrate within a threshold amount of time in the first orientation and in the second orientation.

18. The autoteach system of claim 17, wherein the first width corresponds to a notch or a recess formed by the calibration substrate.

* * * * *